(12) United States Patent
Song et al.

(10) Patent No.: US 12,354,915 B2
(45) Date of Patent: Jul. 8, 2025

(54) DISPLAY SUBSTRATE, MANUFACTURING METHOD THEREOF, AND DISPLAY APPARATUS

(71) Applicants: Chengdu BOE Optoelectronics Technology Co., Ltd., Sichuan Province (CN); BOE Technology Group Co., Ltd., Beijing (CN)

(72) Inventors: Liang Song, Beijing (CN); Long Jiang, Beijing (CN); Mingwen Wang, Beijing (CN); Pengyu Liao, Beijing (CN); Zhong Lu, Beijing (CN); Yuanjie Xu, Beijing (CN); Benlian Wang, Beijing (CN); Lili Du, Beijing (CN); Donghua Jiang, Beijing (CN)

(73) Assignees: Chengdu BOE Optoelectronics Technology Co., Ltd., Sichuan Province (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/769,809

(22) PCT Filed: Apr. 29, 2021

(86) PCT No.: PCT/CN2021/090908
§ 371 (c)(1),
(2) Date: Apr. 18, 2022

(87) PCT Pub. No.: WO2022/226875
PCT Pub. Date: Nov. 3, 2022

(65) Prior Publication Data
US 2024/0153962 A1    May 9, 2024

(51) Int. Cl.
*H10D 86/40* (2025.01)
*H01L 21/77* (2017.01)
(Continued)

(52) U.S. Cl.
CPC .......... *H01L 21/77* (2013.01); *H10D 86/0231* (2025.01); *H10D 86/441* (2025.01); *H10D 86/60* (2025.01)

(58) Field of Classification Search
CPC ... H01L 27/12; H01L 27/124; H01L 27/1288; H01L 21/77; H10D 86/01; H10D 86/40;
(Continued)

(56) References Cited

U.S. PATENT DOCUMENTS 5,596,230 A * 1/1997 Hong ................ H01L 21/76801
257/776
2003/0075800 A1* 4/2003 Ando ................ H01L 21/32139
257/E21.582

FOREIGN PATENT DOCUMENTS

CN          1183641 A      6/1998
CN        103050379 A      4/2013
(Continued)

OTHER PUBLICATIONS

Office Action received for Chinese Patent Application No. 202180001022.8, mailed on Aug. 10, 2024, 21 pages (11 pages of English Translation and 10 pages of Original Document).

*Primary Examiner* — Chuong A Luu
(74) *Attorney, Agent, or Firm* — ArentFox Schiff LLP; Michael Fainberg

(57) ABSTRACT

Embodiments of the disclosure disclose a display substrate, a manufacturing method thereof and a display apparatus. The display substrate includes: a base, having a wire routing region; a first wire routing layer, located on the base, where the first wire routing layer in the wire routing region includes a plurality of first routing wires arranged at intervals, and a space between adjacent first routing wires is smaller than 2 um; an insulation layer, located on a side of the first wire routing layer facing away from the base and having a plurality of first via holes corresponding to the first routing
(Continued)

wires; a first flat layer, located on a side of the insulation layer facing away from the base and having second via holes corresponding to the first via holes, where the second via holes at least partially overlap with the first via holes.

20 Claims, 16 Drawing Sheets

(51) Int. Cl.
*H10D 86/01* (2025.01)
*H10D 86/60* (2025.01)

(58) Field of Classification Search
CPC ... H10D 86/60; H10D 86/441; H10D 86/0231
USPC .......................................................... 257/89
See application file for complete search history.

(56) References Cited

FOREIGN PATENT DOCUMENTS

| | | | |
|---|---|---|---|
| CN | 108807468 | A | 11/2018 |
| CN | 110192271 | A | 8/2019 |
| CN | 110890026 | A | 3/2020 |
| CN | 111653594 | A | 9/2020 |
| WO | 2020/248722 | A1 | 12/2020 |

* cited by examiner

DISPLAY SUBSTRATE, MANUFACTURING METHOD THEREOF, AND DISPLAY APPARATUS

This application is a National Stage of International Application No. PCT/CN2021/090908, filed on Apr. 29, 2021, which is hereby incorporated by reference in its entirety.

FIELD

The disclosure relates to the technical field of display, and particularly to a display substrate, a manufacturing method thereof and a display apparatus.

BACKGROUND

With high-speed development of a smartphone, an attractive appearance of the smartphone is required, and besides, more excellent visual experience needs to be brought to a smartphone user. Various manufacturers have started to increase a screen-to-body ratio of the smartphone, so a full screen becomes a new competition of the smartphone. With development of the full screen, there are increasing demands for improving performance and functions, a camera under panel can bring impact on visual and using experience to a certain degree on the premise of no influence on a high screen-to-body ratio.

SUMMARY

In an aspect, an embodiment of the disclosure provides a display substrate, including: a base, having a wire routing region; a first wire routing layer, located on the base, where the first wire routing layer in the wire routing region includes a plurality of first routing wires arranged at intervals, and a space between adjacent first routing wires is smaller than 2 um; an insulation layer, located on a side of the first wire routing layer facing away from the base and having a plurality of first via holes corresponding to the first routing wires; and a first flat layer, located on a side of the insulation layer facing away from the base and having second via holes corresponding to the first via holes, where the second via holes at least partially overlap with the first via holes.

Optionally, in the above display substrate provided by an embodiment of the disclosure, the insulation layer includes a plurality of independent sub-insulation layers corresponding to the first routing wires, the sub-insulation layers have the first via holes, and a wire width of each of the first routing wires is smaller than or equal to 2 um.

Optionally, in the above display substrate provided by an embodiment of the disclosure, the space between adjacent first routing wires is 0.8 um to 1.8 um, and the wire width of each of the first routing wires is 1.0 um to 1.8 um.

Optionally, in the above display substrate provided by an embodiment of the disclosure, the space between adjacent first routing wires is 1.2 um to 1.6 um, and the wire width of each of the first routing wires is 1.2 um to 1.6 um.

Optionally, the above display substrate provided by an embodiment of the disclosure includes a display region and a bezel region, where the display region includes a first display region and a second display region, and light transmittance of the first display region is larger than light transmittance of the second display region; the first display region includes a plurality of sub-pixels distributed in an array, where the sub-pixels include light-emitting devices and a pixel circuit, the pixel circuit is located in the bezel region adjacent to the first display region, or the second display region has a transition region adjacent to the first display region, and the pixel circuit is located in the transition region; the wire routing region is at least partially located in the first display region, and the first wire routing layer is located between the light-emitting devices and the pixel circuit; and the first routing wires are electrically connected with anodes of the light-emitting devices through corresponding first via holes and corresponding second via holes.

Optionally, the above display substrate provided by an embodiment of the disclosure further includes a second flat layer located between the pixel circuit and the first wire routing layer, and the second flat layer has a plurality of fourth via holes corresponding to the first routing wires; and the first routing wires are electrically connected with the pixel circuit through corresponding fourth via holes.

Optionally, in the above display substrate provided by an embodiment of the disclosure, a material of the first routing wires includes at least one of ITO, a-Si, IZO and IGZO.

Optionally, the above display substrate provided by an embodiment of the disclosure includes a display region and a bezel region, where the display region includes a plurality of signal lines, and the bezel region includes the wire routing region; and the first routing wires are configured to be electrically connected with corresponding signal lines.

Optionally, the above display substrate provided by an embodiment of the disclosure includes a gate metal layer and a source-drain metal layer formed on the base in sequence, where the first wire routing layer is located on the gate metal layer or the source-drain metal layer.

Optionally, the above display substrate provided by an embodiment of the disclosure further includes a second wire routing layer located between the insulation layer and the first flat layer, where the second wire routing layer in the wire routing region includes a plurality of second routing wires arranged at intervals; and grooves are defined by the insulation layer between the adjacent first routing wires, and the second routing wires are at least located in the grooves.

Optionally, in the above display substrate provided by an embodiment of the disclosure, a width of an orthographic projection of each of the second routing wires on the base is smaller than a width of an orthographic projection of the insulation layer between adjacent first via holes on the base.

Optionally, in the above display substrate provided by an embodiment of the disclosure, the orthographic projection of each of the second routing wires on the base approximately overlaps with an orthographic projection of a space between the adjacent first routing wires on the base.

Optionally, in the above display substrate provided by an embodiment of the disclosure, a width of each of the first routing wires is larger than or equal to 1.5 um and smaller than 2 um, and a maximum width of each of the first via holes is larger than or equal to 1.1 um and smaller than 1.6 um; and an orthographic projection of each of the first routing wires on the base has a first annular side edge, an orthographic projection of each of the first via holes on the base has a second annular side edge, and a space between the first annular side edge and the second annular side edge is larger than or equal to 0.2 um.

Optionally, in the above display substrate provided by an embodiment of the disclosure, the first flat layer has third via holes corresponding to the second routing wires.

Optionally, in the above display substrate provided by an embodiment of the disclosure, a sum of a thickness of the second routing wires and a thickness of the insulation layer is approximately equal to a thickness of the first routing wires.

Optionally, the above display substrate provided by an embodiment of the disclosure includes a display region and a bezel region, where the display region includes a first display region and a second display region, and light transmittance of the first display region is larger than light transmittance of the second display region; the first display region includes a plurality of sub-pixels distributed in an array mode, the sub-pixels include light-emitting devices and a pixel circuit, the pixel circuit is located in the bezel region adjacent to the first display region, or the second display region has a transition region adjacent to the first display region, and the pixel circuit is located in the transition region; the wire routing region is at least partially located in the first display region, and the first wire routing layer and the second wire routing layer are located between an anode of the light-emitting device and the pixel circuit; and the first routing wires are electrically connected with anodes of the light-emitting devices through corresponding first via holes and corresponding second via holes, and the second routing wires are electrically connected with the anodes of the light-emitting devices through corresponding third via holes.

Optionally, the above display substrate provided by an embodiment of the disclosure further includes a second flat layer located between the pixel circuit and the first wire routing layer, the second flat layer has a plurality of fourth via holes corresponding to the first routing wires and the second routing wires, and the insulation layer has fifth via holes corresponding to the second routing wires; and the first routing wires are electrically connected with the pixel circuit through corresponding fourth via holes, and the second routing wires are electrically connected with the pixel circuit through corresponding fourth via holes and corresponding fifth via holes.

Optionally, in the above display substrate provided by an embodiment of the disclosure, a material of the first routing wires and a material of the second routing wires include at least one of ITO, a-Si, IZO and IGZO.

Optionally, the above display substrate provided by an embodiment of the disclosure includes a display region and a bezel region, the display region includes a plurality of signal lines, and the bezel region includes the wire routing region; and the first routing wires are configured to be electrically connected with corresponding signal lines, and the second routing wires are configured to be electrically connected with corresponding signal lines.

Optionally, the above display substrate provided by an embodiment of the disclosure includes a gate metal layer and a source-drain metal layer formed on the base in sequence, and the first wire routing layer is located on the gate metal layer or the source-drain metal layer.

Optionally, in the above display substrate provided by an embodiment of the disclosure, a thickness of the insulation layer is 100 Å to 1200 Å.

Optionally, in the above display substrate provided by an embodiment of the disclosure, the thickness of the insulation layer is 500 Å to 1000 Å.

Optionally, in the above display substrate provided by an embodiment of the disclosure, the thickness of the insulation layer is 700 Å to 800 Å.

Optionally, in the above display substrate provided by an embodiment of the disclosure, the material of the insulation layer includes one or a combination of SiNx and SiOx.

In another aspect, an embodiment of the disclosure further provides a manufacturing method of any above display substrate, including: providing the base, where the base has a wire routing region; forming the first wire routing layer and the insulation layer on the base, where the first wire routing layer in the wire routing region includes the plurality of first routing wires arranged independently, the insulation layer is located on the side of the first wire routing layer facing away from the base, and the insulation layer has the plurality of first via holes corresponding to the first routing wires; and forming the first flat layer on the side of the insulation layer facing away from the base, where the first flat layer has second via holes corresponding to the first via holes, and the second via holes at least partially overlap with the first via holes.

Optionally, in the above manufacturing method provided by an embodiment of the disclosure, the forming the first wire routing layer and the insulation layer on the base includes: depositing a first conductive layer on the wire routing region of the base; depositing the insulation layer on a side of the first conductive layer facing away from the base, and patterning the insulation layer to form a patterned insulation layer; etching the first conductive layer by using the patterned insulation layer as a mask to form the plurality of first routing wires arranged independently; depositing the first flat layer on a side of the patterned insulation layer facing away from the base, and patterning the first flat layer to form the second via holes corresponding to the first routing wires; and etching the patterned insulation layer by using the first flat layer with the second via holes as a mask to form the first via holes corresponding to the second via holes.

Optionally, in the above manufacturing method provided by an embodiment of the disclosure, the forming the first wire routing layer and the insulation layer on the base includes: depositing the first conductive layer on the wire routing region of the base; patterning the first conductive layer to form the plurality of first routing wires arranged independently; depositing the insulation layer on a side of the first conductive layer with the plurality of first routing wires formed thereon facing away from the base, where grooves are defined by the insulation layer between the adjacent first routing wires; depositing a second conductive layer on a side of the insulation layer facing away from the base, and patterning the second conductive layer to form the plurality of second routing wires at least located in corresponding grooves, and a thickness of the second conductive layer before patterning is larger than a thickness of the first conductive layer before patterning; depositing the first flat layer on a side of the second conductive layer with the plurality of second routing wires formed thereon facing away from the base, and patterning the first flat layer to form the second via holes corresponding to the first routing wires, and the third via holes corresponding to the second routing wires; and etching the insulation layer by using the first flat layer having the second via holes and the third via holes as a mask to form the first via holes corresponding to the second via holes.

Optionally, in the above manufacturing method provided by an embodiment of the disclosure, the thickness of the second conductive layer before patterning is approximately 200 Å larger than the thickness of the first conductive layer before patterning, and a sum of a thickness of the second routing wires and a thickness of the insulation layer is approximately equal to a thickness of the first routing wires.

Optionally, the above manufacturing method provided by an embodiment of the disclosure further includes: forming a plurality of anodes on a side of the first flat layer with the second via holes formed thereon facing away from the base, where the anodes are electrically connected with the first routing wires through corresponding second via holes and corresponding first via holes.

In another aspect, an embodiment of the disclosure further provides a display apparatus, including any above display substrate.

DETAILED DESCRIPTION OF EMBODIMENTS

Figure 1:
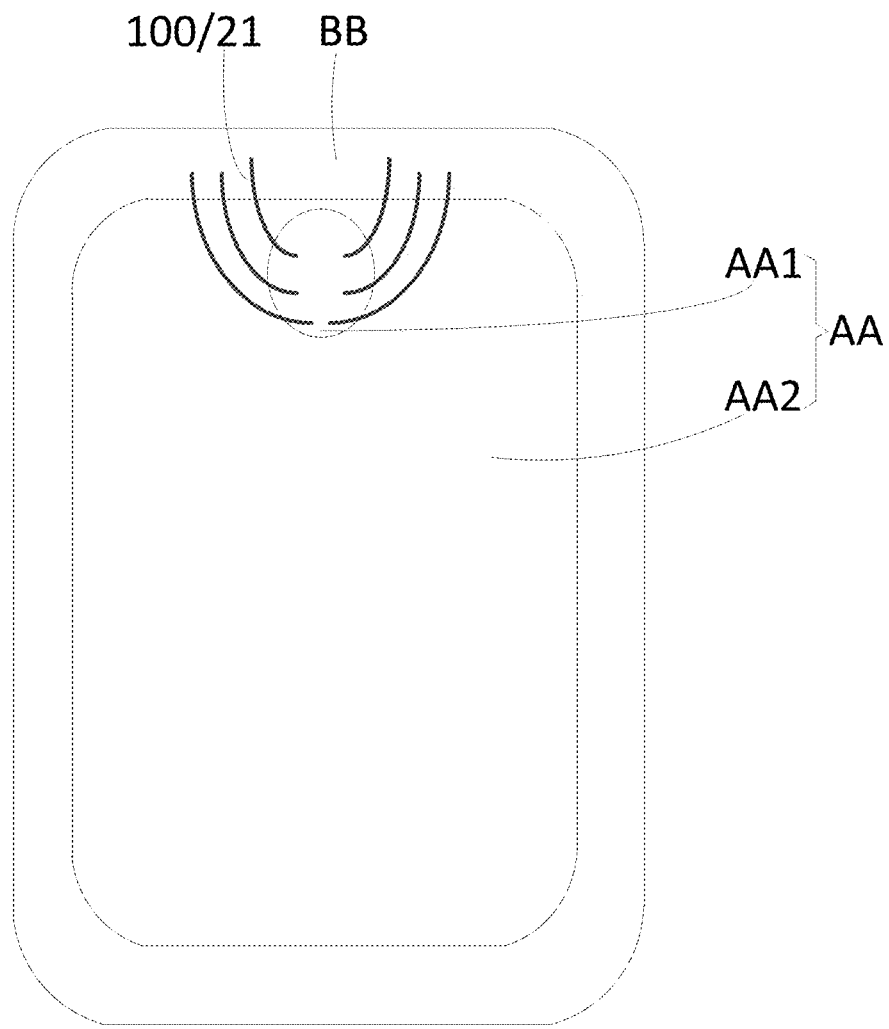
FIG. 1 is a schematic structural top view of a display substrate provided by an embodiment of the disclosure.

In order to make objectives, technical solutions and advantages of embodiments of the disclosure clearer, technical solutions of embodiments of the disclosure are described clearly and completely below with reference to the drawings of embodiments of the disclosure. Apparently, the described embodiments are some, but not all, embodiments of the disclosure. Embodiments and features in embodiments of the disclosure may be mutually combined under the condition of no conflict. Based on the described embodiments of the disclosure, all other embodiments obtained by those ordinarily skilled in the art without creative work fall within the protection scope of the disclosure.

Unless otherwise defined, technical or scientific terms used in the disclosure should be commonly understood by those ordinarily skilled in the art. "Include" or "contain" and other similar words used in the disclosure mean that an element or an item preceding the word covers elements or items and their equivalents listed after the word without excluding other elements or items. "Connection" or "connected" and other similar words may include electrical connection, direct or indirect, instead of being limited to physical or mechanical connection. "Inside", "outside", "up", "down" and the like are only used for representing a relative position relation, and when an absolute position of a described object changes, the relative position relation may also change correspondingly.

It should be noted that a size and a shape of each figure in the drawings do not reflect a true scale and are only intended to illustrate contents of the disclosure. The same or similar reference numbers represent the same or similar elements or elements with the same or similar function all the time.

Figure 2:
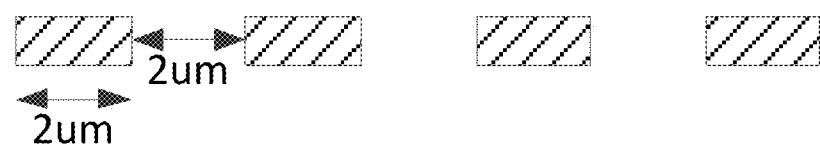
FIG. 2 is a schematic diagram of wire width and wire space of a wire routing layer manufactured by using a photoresist process in the related art.
Figure 3:
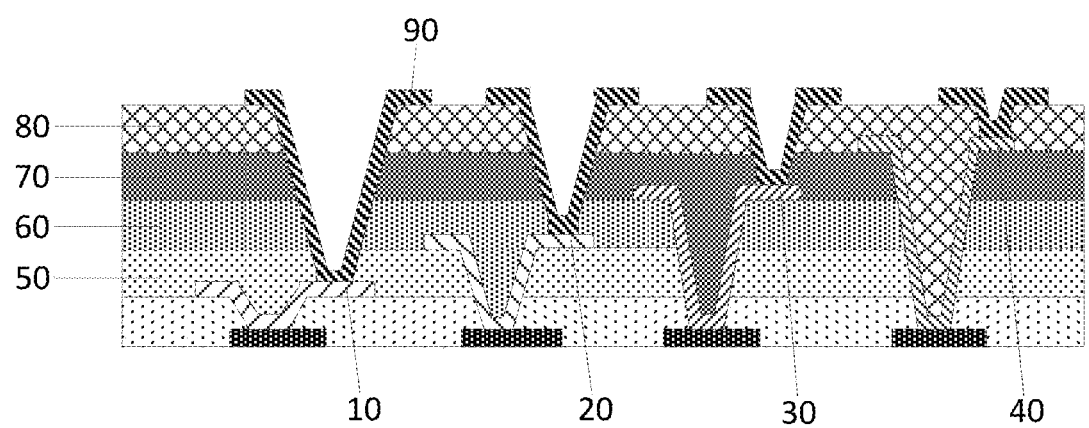
FIG. 3 is a schematic structural diagram of a display substrate provided by the related art.

In the related art, as shown in FIG. 1, as for a camera under panel technology, a first display region AA1 and a second display region AA2 are generally arranged in a display region AA, the second display region AA2 accounts most of the display region, the first display region AA1 accounts the smaller part of the display region, and the first display region AA1 is where a camera under panel is placed. The camera under panel means that a front camera is located below a screen but will not affect a screen display function, and when the front camera is idle, the screen above the camera may still display an image normally. There is no camera hole in the camera under panel in appearance, thereby realizing a real full screen display effect. However, in a current camera under panel design solution, a pixel circuit of the first display region AA1 is arranged in a bezel region BB above the first display region AA1 or a second display region AA2 adjacent to the first display region AA1. Taking the pixel circuit being arranged in the bezel region BB above the first display region AA1 for example, the pixel circuit is connected with light-emitting devices in the first display region AA1 through ITO routing wires 100, and in this way, surrounding pixel signals are transmitted to a camera under panel region. As shown in FIG. 2, which is a schematic diagram of ITO routing wires on the same layer, the ITO routing wires are formed by using photoresist exposure, developing and etching processes, due to a photoresist minimum exposure distance and minimum exposure wire width requirement, the ITO routing wires on the same layer have a minimum wire width and wire space. At present, the limit of the width in a factory is generally (about 2 um or above), and the limit of the space is (about 2 um or above), and therefore, the quantity of ITO routing wires distributed on the same layer is limited. When there are many light-emitting devices in the first display region AA1 (the camera under panel region), a plurality of layers of ITO routing wires are needed. As shown in FIG. 3, which takes four layers of ITO routing wires being used for connecting the pixel circuit and the light-emitting devices for example, the four layers of ITO routing wires are shown as 10, 20, 30 and 40 respectively, each layer of ITO routing wires needs to be covered with an organic layer (a flat layer), namely, four flat layers (50, 60, 70 and 80) are needed, the four flat layers (50, 60, 70 and 80) need to be patterned respectively to form via holes corresponding to anodes 90 of the light-emitting devices. The quantity of masks of this type of patterning is large, consequently, process time is long, cost is high, and it is quite difficult to apply to actual mass production.

Figure 4:
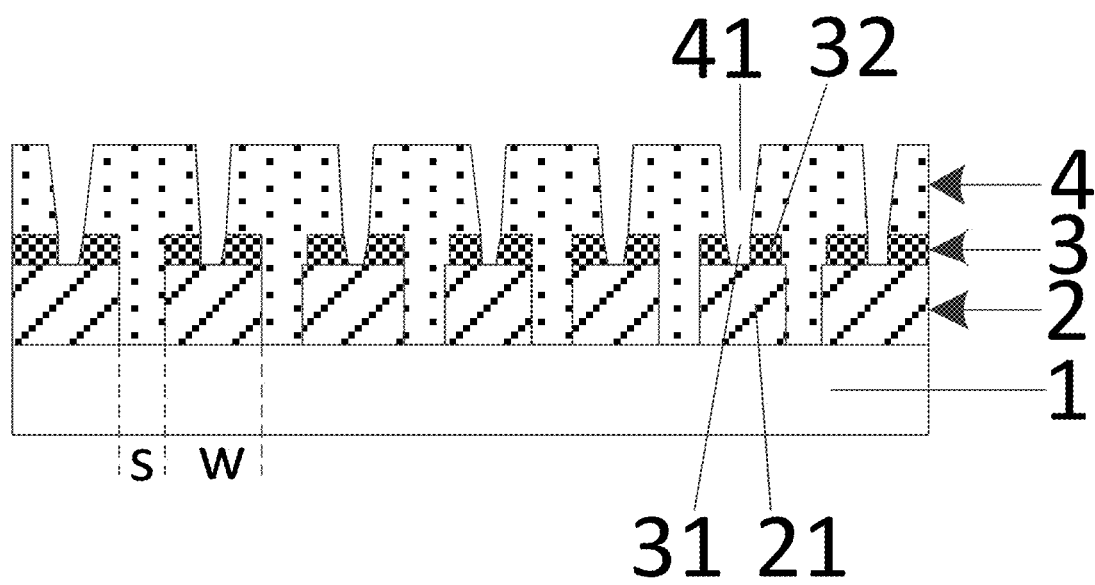
FIG. 4 is a schematic structural diagram of a display substrate provided by an embodiment of the disclosure.
Figure 5:
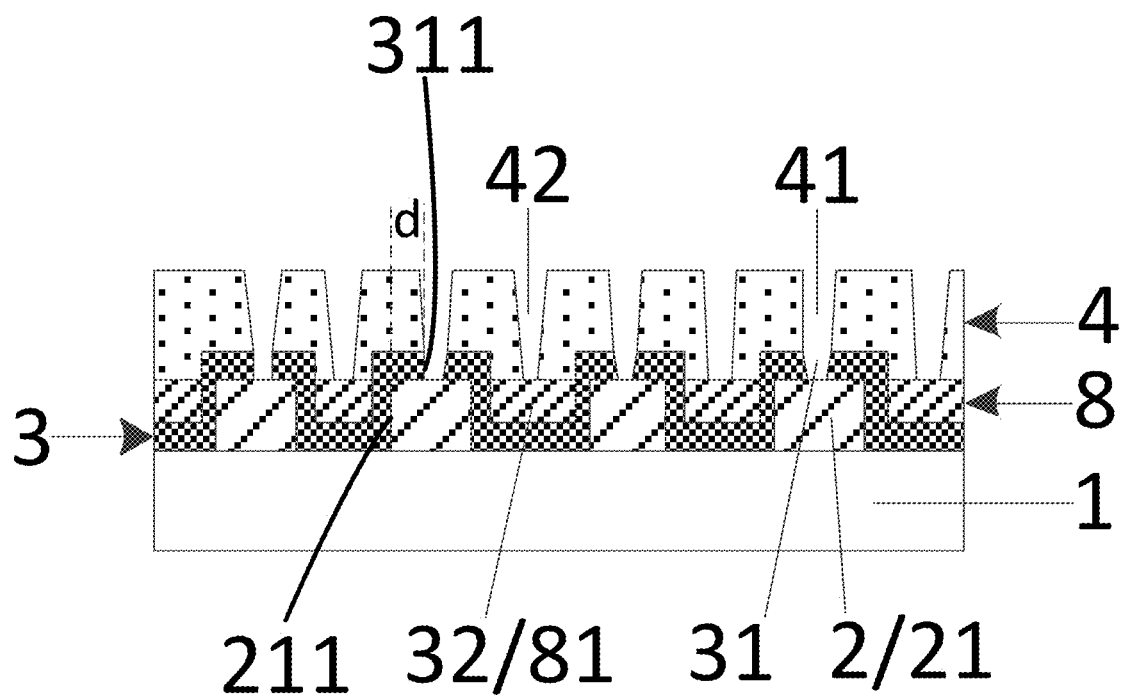
FIG. 5 is a schematic structural diagram of another display substrate provided by an embodiment of the disclosure.

In order to solve the problem that the quantity of ITO routing wires distributed on the same layer is limited in the related art, a plurality of layers of ITO routing wires are needed, which causes problems of many masks and high cost, an embodiment of the disclosure provides a display substrate, as shown in FIG. 4 and FIG. 5, the display substrate including following parts.

A base 1 has a wire routing region, and only the wire routing region is illustrated in FIG. 1.

A first wire routing layer 2 is located on the base 1, the first wire routing layer 2 in the wire routing region includes a plurality of first routing wires 21 arranged at intervals, and a space S between adjacent first routing wires 21 is smaller than 2 um.

An insulation layer 3 is located on a side of the first wire routing layer 2 facing away from the base 1 and having a plurality of first via holes 31 corresponding to the first routing wires 21.

A first flat layer 4 is located on a side of the insulation layer 3 facing away from the base 1 and having second via holes 41 corresponding to the first via holes 31, and second via holes 41 at least partially overlap with the first via holes 31.

In the above display substrate provided by an embodiment of the disclosure, the insulation layer 3 is arranged between the first wire routing layer 2 and the first flat layer 4, in this way, a method of manufacturing routing wires by using the photoresist process in the related art may be changed so that a space between every adjacent first routing wires 21 is smaller than 2 um, thus more wires can be distributed in the same wiring space. For the same quantity of the routing wires, the disclosure can reduce the quantity of layers of the routing wires, flat layers above wire routing layers can be reduced, the quantity of patterned masks is reduced, and manufacturing cost is reduced.

During specific implementation, in the above display substrate provided by an embodiment of the disclosure, as shown in FIG. 4, the insulation layer 3 includes a plurality of independent sub-insulation layers 32 corresponding to the first routing wires 21, and the sub-insulation layers 32 have the first via holes 31. In this way, when an embodiment of the disclosure manufactures the first routing wires 21, after deposition of a material for manufacturing the first routing wires 21 on the base 1 is completed, the insulation layer 3 may be deposited. Exposure resolution of a material of the insulation layer 3 is higher than that of the photoresist material in the related art, smaller wire width/wire space ratio may be made, and the material of the insulation layer 3 may be SiNx and/or SiOx. As for routing wires manufactured by using the photoresist process at present, due to requirements of the minimum wire width and the minimum wire space, the routing wires on the same layer have the minimum wire width and wire space, at present, the factory manufacturing limits include: the minimum wire width (about 2 um or above) and the minimum wire space (about 2 um or above), and thus the quantity of the routing wires distributed on the same layer is limited. The disclosure replaces photoresist in the related art with the insulation layer 3, the first wire routing layer 2 is etched by using the insulation layer 3 as the mask, then more first routing wires 21 with a smaller wire width/wire space ratio may be manufactured on the first wire routing layer 2, that is, the space S between every adjacent first routing wires 21 is smaller than 2 um, and the wire width W of the first routing wires 21 is smaller than or equal to 2 um. In this way, more routing wires can be distributed on the same wire routing layer, so that the quantity of masks is reduced, cost is reduced, and input time is shortened.

It should be noted that the space S between every adjacent first routing wires 21 and the wire width W of each of the first routing wires 21 in FIG. 4 are only illustrative and do not represent true sizes.

Furthermore, in the above display substrate provided by an embodiment of the disclosure, as shown in FIG. 4, the space S between every adjacent first routing wires 21 manufactured by using the insulation layer 3 as the mask may be 0.8 um to 1.8 um, which may be 1 um, 1.2 um, 1.5 um and 1.7 um. The wire width W of each of the manufactured first routing wires 21 may be 1.0 um to 1.8 um, which may be 1.2 um, 1.5 um and 1.7 um.

Figure 6:
FIG. 6 is a schematic diagram of wire width and wire space of a wire routing layer manufactured by using an insulation layer process in an embodiment of the disclosure.

Furthermore, in the above display substrate provided by an embodiment of the disclosure, as shown in FIG. 6, which is a schematic diagram of the first wire routing layer 2 and the insulation layer 3 in FIG. 4, the space S between every adjacent first routing wires 21 and the wire width of each of the first routing wires 21 are set to be equal, optionally, 1.2 um to 1.6 um, and FIG. 6 takes the space S between every adjacent first routing wires 21 and the wire width of each of the first routing wires 21 being 1.5 um respectively for example. Taking a wiring space of 200 um for example, in the related art, only 50 routing wires can be distributed on one layer by using the photoresist process, however, by using the solution of an embodiment of the disclosure, for example, the wire width/wire space may be reduced to 1.5 um/1.5 um, so 67 routing wires can be distributed within the wiring space of 200 um, the quantity of layers of routing wires can be reduced, the quantity of masks of the flat layer is reduced, and cost is reduced.

Figure 7:
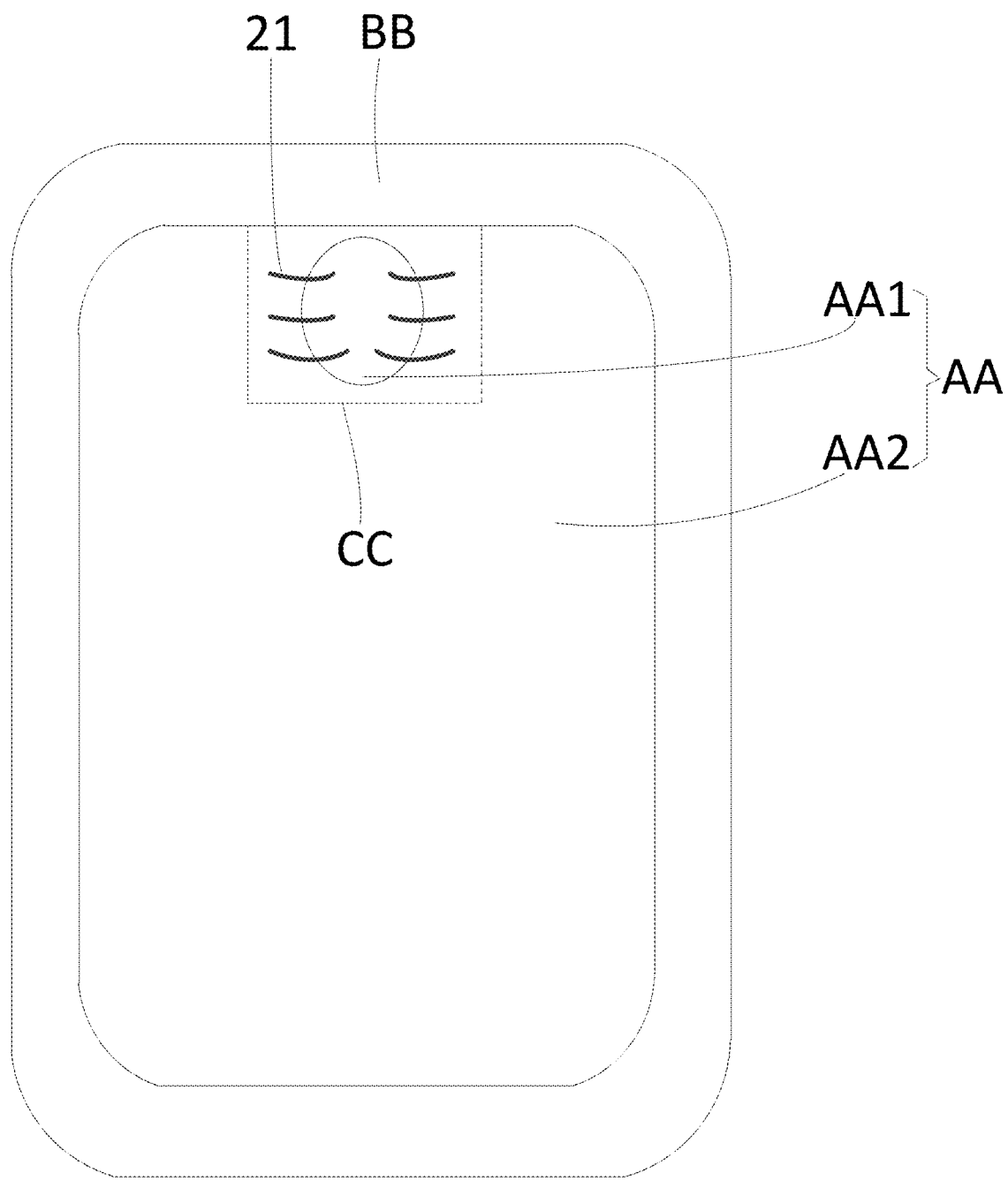
FIG. 7 is a schematic structural top view of another display substrate provided by an embodiment of the disclosure.

During specific implementation, the above display substrate provided by an embodiment of the disclosure, as shown in FIG. 1 and FIG. 7, includes a display region AA and a bezel region BB, the display region AA includes a first display region AA1 and a second display region AA2, and light transmittance of the first display region AA1 is larger than light transmittance of the second display region AA2.

The first display region AA1 includes a plurality of sub-pixels (not shown) distributed in an array, the sub-pixels include light-emitting devices and a pixel circuit (not shown). As shown in FIG. 1, the pixel circuit may be located in the bezel region BB adjacent to the first display region AA1, or as shown in FIG. 7, the second display region AA2 has a transition region CC adjacent to the first display region AA1, and the pixel circuit is located in the transition region CC.

Figure 8:
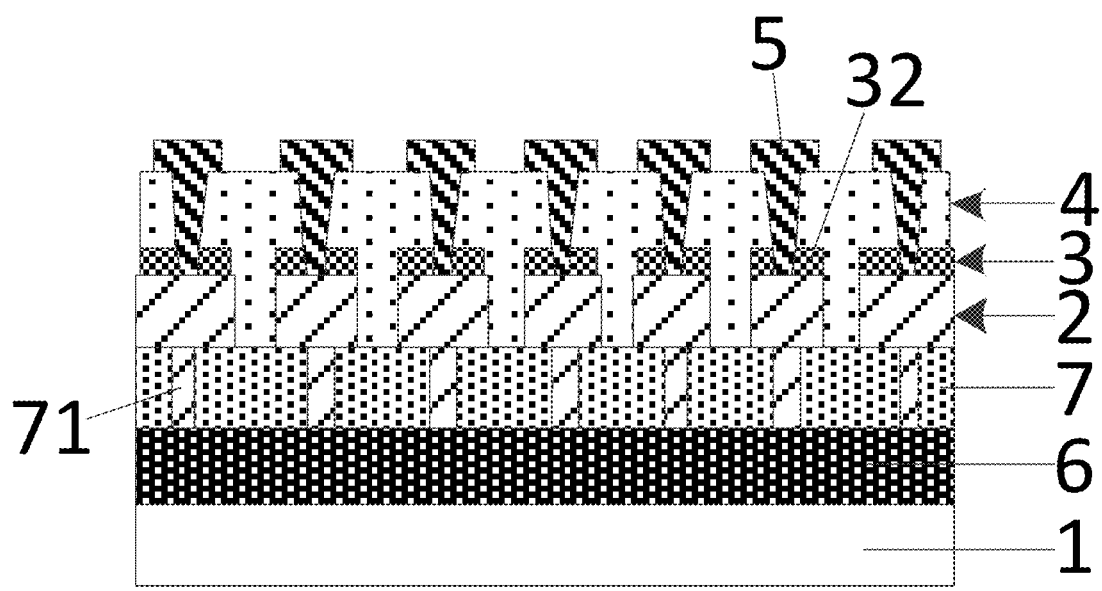
FIG. 8 is a schematic structural diagram of another display substrate provided by an embodiment of the disclosure.

As shown in FIG. 1 and FIG. 7, the wire routing region shown in FIG. 4 is at least partially located in the first display region AA1. As shown in FIG. 8, the first wire routing layer 2 is located between anodes 5 of the light-emitting devices and the pixel circuit 6. The pixel circuit 6 may include but is not limited to a 7T1C structure of seven transistors and one capacitor, the pixel circuit 6 includes a source-drain electrode layer, and the first wire routing layer 2 is electrically connected with the source-drain electrode layer of the pixel circuit.

As shown in FIG. 8, the first routing wires 21 are electrically connected with the anodes 5 of the light-emitting devices through corresponding first via holes 31 and corresponding second via holes 41 (referring to FIG. 4).

During specific implementation, the above display substrate provided by an embodiment of the disclosure, as shown in FIG. 8, further includes a second flat layer 7 located between the pixel circuit 6 and the first wire routing layer 2, and the second flat layer 7 has a plurality of fourth via holes 71 corresponding to the first routing wires 21.

The first routing wires 21 are electrically connected with the pixel circuit 6 through corresponding fourth via holes 71.

During specific implementation, in the above display substrate provided by an embodiment of the disclosure, as shown in FIG. 4 and FIG. 8, a material of the first routing wires 21 may include but is not limited to at least one of ITO, a-Si, IZO and IGZO.

Figure 9:
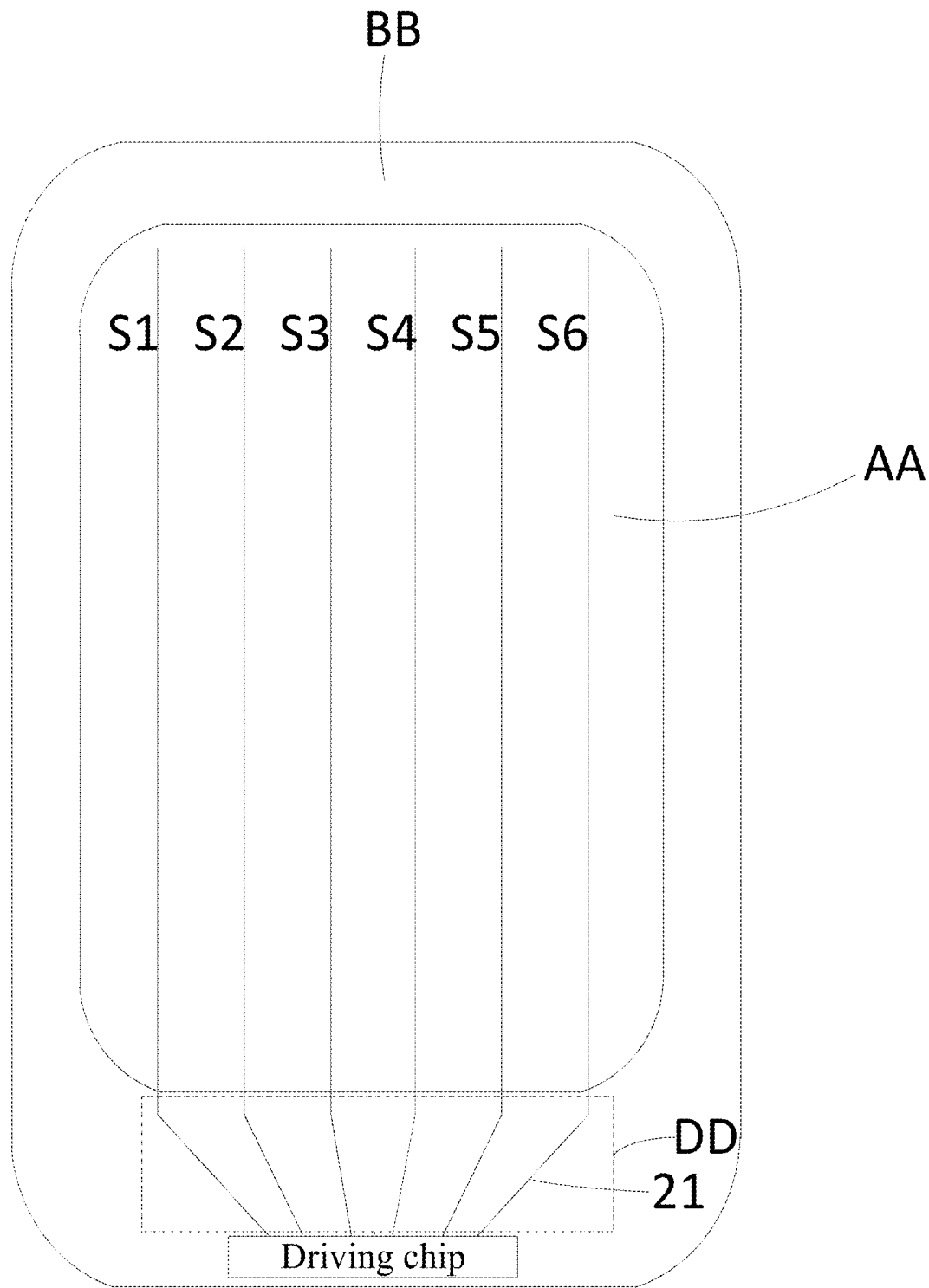
FIG. 9 is a schematic structural top view of another display substrate provided by an embodiment of the disclosure.

During specific implementation, in the above display substrate provided by an embodiment of the disclosure, the wire routing region shown in FIG. 4 and FIG. 8 are not only suitable for a camera under panel region, but also suitable for a sector region (the sector region is configured to make a signal line, such as a data line, in the display region AA be connected to an external driving chip to realize signal transmission). As shown in FIG. 9, the display substrate includes the display region AA and the bezel region BB, the display region AA includes a plurality of signal lines (for example, data lines S1, S2, S3 . . . ), and the bezel region BB includes the wire routing region shown in FIG. 4 (the wire routing region is the sector region DD).

The first routing wires 21 are configured to be electrically connected with corresponding signal lines (for example, the data lines S1, S2, S3 . . . ).

During specific implementation, the above display substrate provided by an embodiment of the disclosure, as shown in FIG. 9, includes a gate metal layer and a source-drain metal layer formed on the base in sequence, and the first wire routing layer 2 may be located on the gate metal layer or the source-drain metal layer. In this way, an original pattern only needs to be changed when forming the gate metal layer or the source-drain metal layer, so that patterns of the first wire routing layer 2 and the gate metal layer or the source-drain metal layer are formed through a one-time patterning process, a process of independently fabricating the first wire routing layer 2 does not need to be added, the fabricating process flow can be simplified, production cost can be reduced, and production efficiency can be improved.

During specific implementation, the above display substrate provided by an embodiment of the disclosure, as shown in FIG. 5, further includes a second wire routing layer 8 located between the insulation layer 3 and the first flat layer 4, and the second wire routing layer 8 in the wire routing region includes a plurality of second routing wires 81 arranged at intervals.

Grooves 32 are defined by the insulation layer 3 between adjacent first routing wires 21, and the second routing wires 81 are at least located in the grooves 32. In this way, during manufacturing of the insulation layer 3, a thin insulation layer 3 may be manufactured, an upper surface of the second routing wires 81 is approximately flush with an upper surface of the first routing wires 21, the first wire routing layer 2 is insulated from the second wire routing layer 8 through the insulation layer 3, equivalently, wiring on the same layer is performed on the first wire routing layer 2 and the second wire routing layer 8, more routing wires can be distributed in the same wiring space, the quantity of layers of the routing wires is reduced, the quantity of masks in the subsequent manufacturing process is reduced, and cost is reduced.

During specific implementation, in the above display substrate provided by an embodiment of the disclosure, as shown in FIG. 5, a width of an orthographic projection of each of the second routing wires 81 on the base 1 is smaller than a width of an orthographic projection of the insulation layer 3 between adjacent first via holes 31 on the base 1. In this way, the second routing wires 81 will not cover positions of the first via holes 31, so etching of the second routing wires 81 to expose a region corresponding to the first via holes 31 does not need to be performed again subsequently.

Figure 10:
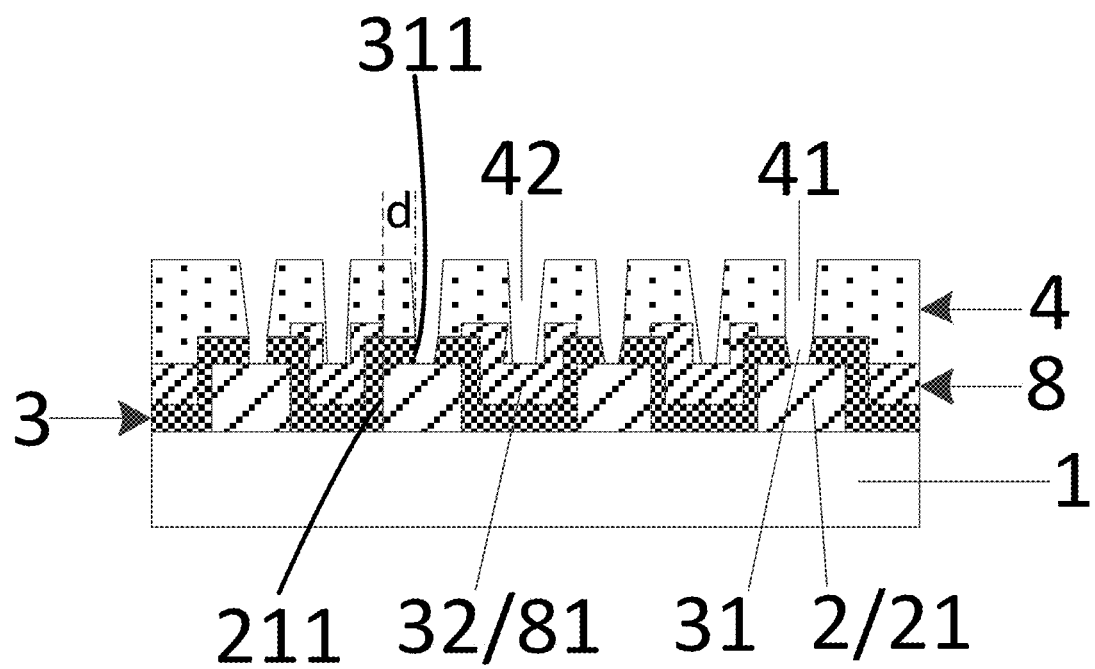
FIG. 10 is a schematic structural diagram of another display substrate provided by an embodiment of the disclosure.
Figure 11:
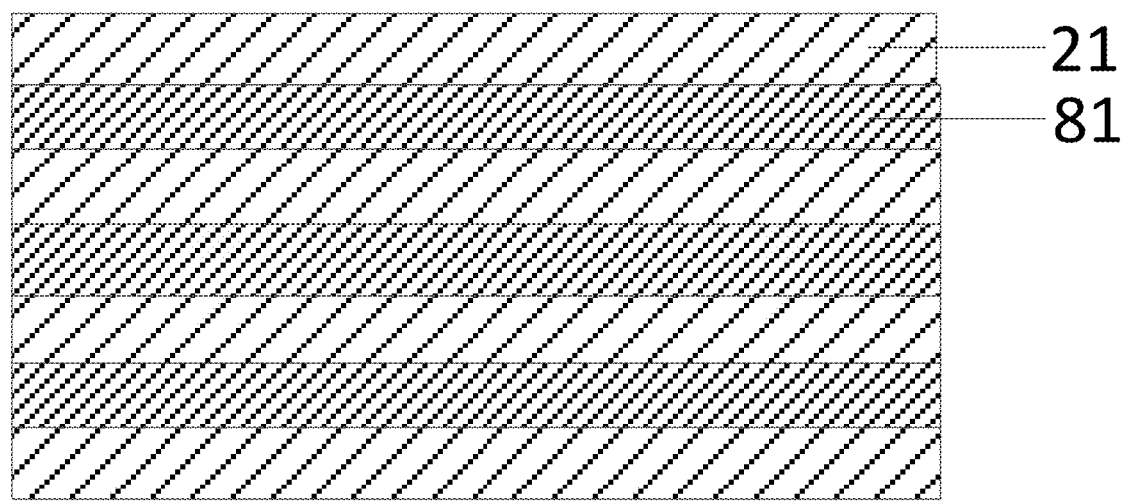
FIG. 11 is a schematic top view of first routing wires and second routing wires in FIG. 10.

During specific implementation, in the above display substrate provided by an embodiment of the disclosure, as shown in FIG. 10, an orthographic projection of each of the second routing wires 81 on the base 1 approximately overlaps with an orthographic projection of a space between the adjacent first routing wires 21 on the base 1. As shown in FIG. 11, which is a schematic top view of the second routing wires 81 and the first routing wires 21 on the base 1 in FIG. 10, the second routing wires 81 and the first routing wires 21 may be distributed in spacing of 0. As the insulation layer 3 may be arranged to be quite thin, in a thickness direction, the upper surfaces of the first routing wires 21 and the second routing wires 81 may be arranged to be basically flush. FIG. 10 is only illustrative, and the insulation layer 3 is quite thin during actual manufacturing. Taking a space of 200 um for example, only 50 routing wires can be distributed on the same wire routing layer manufactured by using the photoresist process in the related art. However, if a structure shown in FIG. 10 is adopted, wiring of the second routing wires 81 and the first routing wires 21 is equivalent to wiring on the same layer, in this way, the wiring space is not limited by the wire width and the wire space, wiring in spacing of 0 can be performed between the two layers of the routing wires, so 100 routing wires can be distributed in the space of 200 um, the quantity of the layers of the routing wires can be reduced by half, and thus the quantity of masks of the flat layer can be reduced by half.

During specific implementation, in the above display substrate provided by an embodiment of the disclosure, as shown in FIG. 5 and FIG. 10, a width of each of the first routing wires 21 is larger than or equal to 1.5 um and smaller than 2 um; and the first via holes 31 are obtained through etching, a section shape of each of the first via holes 31 is generally trapezoidal due to influence of factors of an etching rate, and in order to guarantee that the insulation layer 3 covers the surrounding of the first routing wires 21, a maximum width of each of the first via holes 31 is larger than or equal to 1.1 um and smaller than 1.6 um.

An orthographic projection of each of the first routing wires 21 on the base 1 has a first annular side edge 211, an orthographic projection of each of the first via holes 31 on the base 1 has a second annular side edge 311, a distance d between the first annular side edge 211 and the second annular side edge 311 is larger than or equal to 0.2 um, and thus it can be guaranteed that the first routing wires 21 are insulated from the second routing wires 81 through the insulation layer 3.

During specific implementation, in the above display substrate provided by an embodiment of the disclosure, as shown in FIG. 5 and FIG. 10, the first flat layer 4 has third via holes 42 corresponding to the second routing wires 81, so the second routing wires 81 are electrically connected with subsequently manufactured anodes through the third via holes 42.

During specific implementation, in the above display substrate provided by an embodiment of the disclosure, as shown in FIG. 5 and FIG. 10, as the insulation layer 3 may be manufactured to be quite thin, so when the second routing wires 81 are manufactured, a sum of a thickness of the second routing wires 81 and a thickness of the insulation layer 3 may be approximately equal to a thickness of the first routing wires 21. That is, the upper surface of the second routing wires 81 is approximately flush with the upper surface of the first routing wires 21, equivalently, wiring on the same layer is performed on the first wire routing layer 2 and the second wire routing layer 8, thus more routing wires can be distributed in the same wiring space, the quantity of the layers of the routing wires is reduced, the quantity of masks in the subsequent manufacturing process is reduced, and cost is reduced.

During specific implementation, the above display substrate provided by an embodiment of the disclosure, as shown in FIG. 1 and FIG. 7, includes the display region AA and the bezel region BB, the display region AA includes the first display region AA1 and the second display region AA2, and light transmittance of the first display region AA1 is larger than light transmittance of the second display region AA2.

The first display region AA1 includes a plurality of sub-pixels (not shown) distributed in an array, the sub-pixels include light-emitting devices and a pixel circuit (not shown). As shown in FIG. 1, the pixel circuit may be located in the bezel region BB adjacent to the first display region AA1, or as shown in FIG. 7, the second display region AA2 has a transition region CC adjacent to the first display region AA1, and the pixel circuit is located in the transition region CC.

Figure 12:
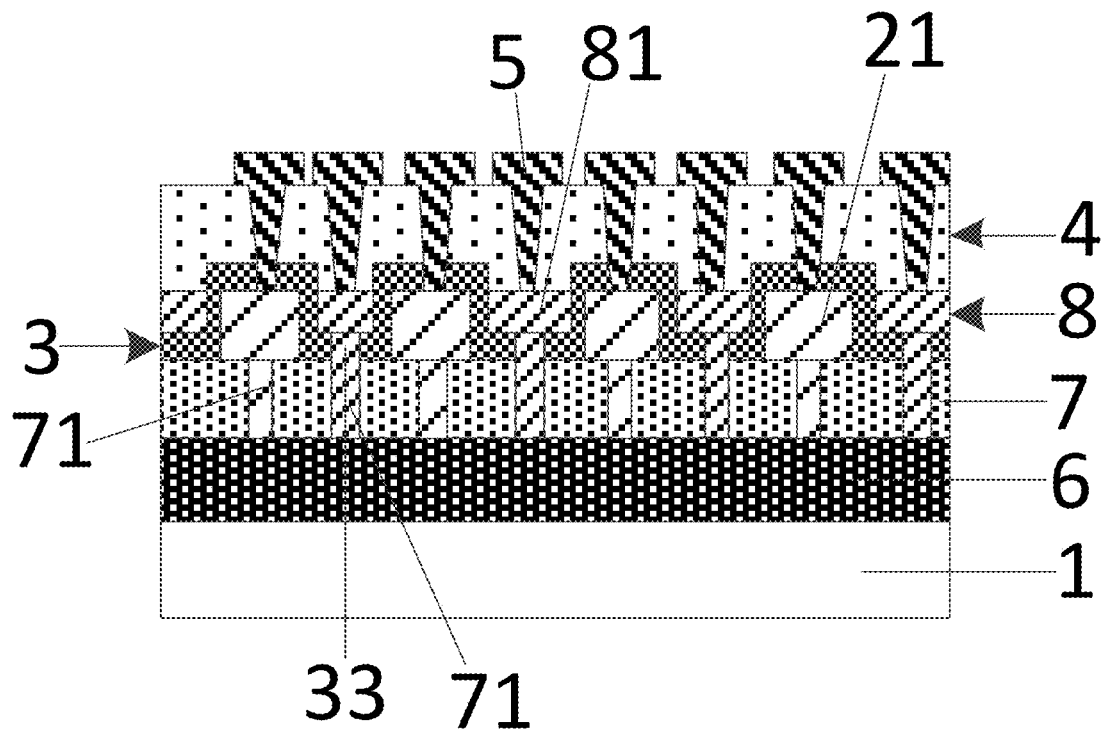
FIG. 12 is a schematic structural top view of another display substrate provided by an embodiment of the disclosure.

As shown in FIG. 1 and FIG. 7, the wire routing region shown in FIG. 5 and FIG. 10 is at least partially located in the first display region AA1. As shown in FIG. 12, the first wire routing layer 2 and the second wire routing layer 8 are located between anodes 5 of the light-emitting devices and the pixel circuit 6. The pixel circuit 6 may include but is not limited to a 7T1C structure of seven transistors and one capacitor, the pixel circuit 6 includes the source-drain electrode layer, and the first wire routing layer 2 and the second wire routing layer 8 are respectively electrically connected with the source-drain electrode layer corresponding to the pixel circuit.

As shown in FIG. 12, the first routing wires 21 are electrically connected with the anodes 5 of the light-emitting devices through corresponding first via holes 31 and corresponding second via holes 41 (referring to FIG. 5), and the second routing wires 81 are electrically connected with the anodes 5 of the light-emitting devices through corresponding third via holes 42.

During specific implementation, the above display substrate provided by an embodiment of the disclosure, as shown in FIG. 12, further includes a second flat layer 7 located between the pixel circuit 6 and the first wire routing layer 2. The second flat layer 7 has a plurality of fourth via holes 71 corresponding to the first routing wires 21 and the second routing wires 81, and the insulation layer 3 has fifth via holes 33 corresponding to the second routing wires 81.

The first routing wires 21 are electrically connected with the pixel circuit 6 through corresponding fourth via holes 71, and the second routing wires 81 are electrically connected with the pixel circuit 6 through corresponding fourth via holes 71 and corresponding fifth via holes 33.

During specific implementation, in the above display substrate provided by an embodiment of the disclosure, as shown in FIG. 5 and FIG. 12, materials of the first routing wires 21 and the second routing wires 81 may include but are not limited to at least one of ITO, a-Si, IZO and IGZO.

During specific implementation, the materials used for the first routing wires 21 and the second routing wires 81 may be the same type or different types. When the first routing wires 21 and the second routing wires 81 adopt the same material, optionally, the material is ITO (indium tin oxide).

During specific implementation, when the first via holes 31 corresponding to the first routing wires 21 are formed by etching the insulation layer 3, the second routing wires 81 have no cover, an etching material may perform certain etching on the surface of the second routing wires 81, so a morphology of a surface of the second routing wires 81 is rougher than a morphology of a surface of the first routing wires 21.

During specific implementation, in the above display substrate provided by an embodiment of the disclosure, the wire routing region shown in FIG. 5 and FIG. 12 are not only suitable for the camera under panel region, but also suitable for the sector region (the sector region is configured to make the signal line, such as the data line, of the display region AA be connected to the external driving chip to realize signal transmission). As shown in FIG. 9, the display substrate includes the display region AA and the bezel region BB, the display region AA includes a plurality of signal lines (for example, the data lines S1, S2, S3 . . . ), and the bezel region BB includes the wire routing region shown in FIG. 5 (the wire routing region is the sector region DD).

The first routing wires 21 are configured to be electrically connected with corresponding signal lines (for example, the data lines S1, S2, S3 . . . ), and the second routing wires 81 are configured to be electrically connected with corresponding signal lines (for example, the data lines S1, S2, S3 . . . ).

During specific implementation, the above display substrate provided by an embodiment of the disclosure, as shown in FIG. 9, includes the gate metal layer and the source-drain metal layer formed on the base in sequence, and the first wire routing layer 2 is located on the gate metal layer or the source-drain metal layer. In this way, an original pattern only needs to be changed when forming the gate metal layer or the source-drain metal layer, so that patterns of the first wire routing layer 2 and the gate metal layer or the source-drain metal layer are formed through a one-time patterning process, a process of independently fabricating the first wire routing layer 2 does not need to be added, the fabricating process flow can be simplified, production cost can be reduced, and production efficiency can be improved. For example, if the first wire routing layer 2 is located on the gate metal layer, then the second wire routing layer 8 may be located on the source-drain metal layer; if the first wire routing layer 2 is located on the source-drain metal layer, then the second wire routing layer 8 may be located between the source-drain metal layer and the anode.

During specific implementation, in the above display substrate provided by an embodiment of the disclosure, as shown in FIG. 4, FIG. 8, FIG. 5 and FIG. 12, a thickness of the insulation layer 3 may be 100 Å to 1200 Å.

During specific implementation, in the above display substrate provided by an embodiment of the disclosure, as shown in FIG. 4, FIG. 8, FIG. 5 and FIG. 12, the thickness of the insulation layer 3 is preferably 500 Å to 1000 Å.

During specific implementation, in the above display substrate provided by an embodiment of the disclosure, as shown in FIG. 4, FIG. 8, FIG. 5 and FIG. 12, the thickness of the insulation layer 3 is more preferably 700 Å to 800 Å.

During specific implementation, in the above display substrate provided by an embodiment of the disclosure, as shown in FIG. 4, FIG. 8, FIG. 5 and FIG. 12, a material of the insulation layer 3 may include but is not limited to one or a combination of SiNx and SiOx.

Figure 13:
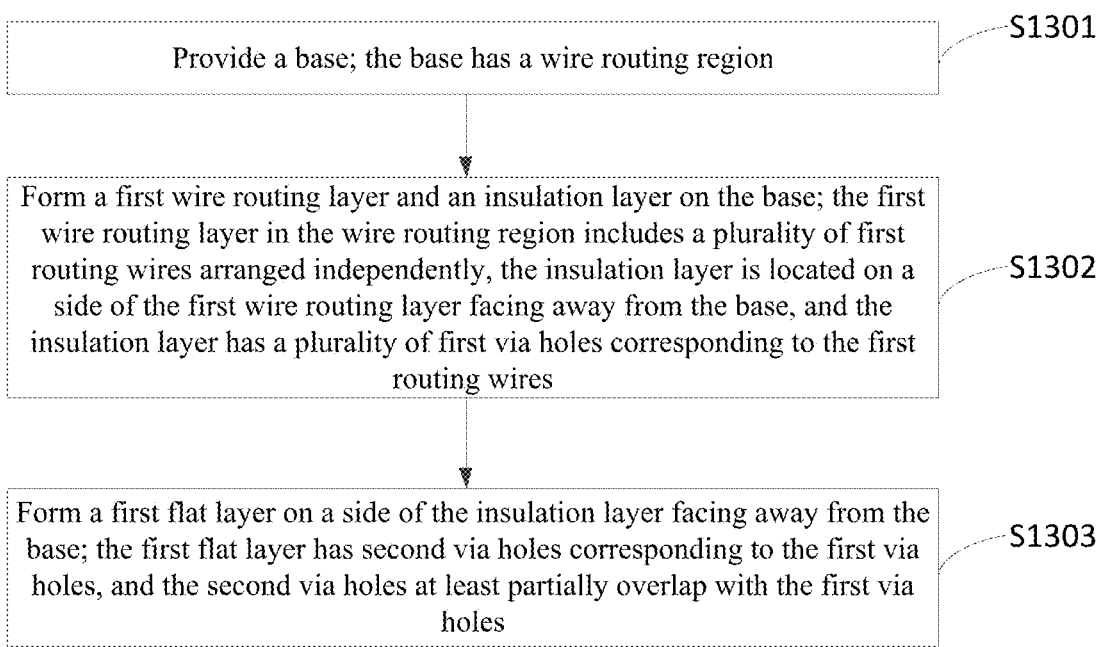
FIG. 13 is a schematic flowchart of a manufacturing method of a display substrate provided by an embodiment of the disclosure.

Based on the same inventive concept, an embodiment of the disclosure further provides a manufacturing method of any above display substrate, as shown in FIG. 13, including following steps.

S1301, a base is provided; the base has a wire routing region.

S1302, a first wire routing layer and an insulation layer are formed on the base; the first wire routing layer in the wire routing region includes a plurality of first routing wires arranged independently, the insulation layer is located on a side of the first wire routing layer facing away from the base, and the insulation layer has a plurality of first via holes corresponding to the first routing wires.

S1303, a first flat layer is formed on a side of the insulation layer facing away from the base; the first flat layer has second via holes corresponding to the first via holes, and the second via holes at least partially overlap with the first via holes.

The manufacturing method of the display substrate shown in FIG. 4 is described in detail below, which may include following steps.

Figure 14A:
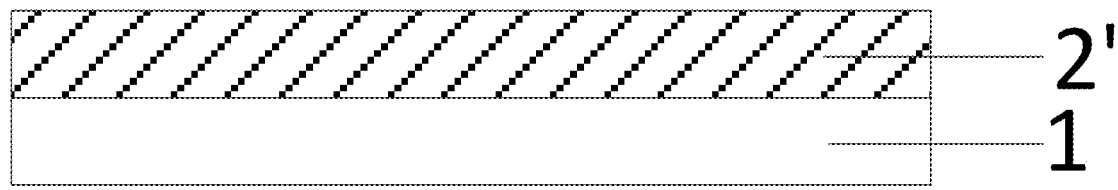
FIG. 14A to FIG. 14H are schematic sectional views after executing every step of manufacturing the display substrate shown in FIG. 4.

(1) A first conductive layer 2' is deposited on the wire routing region of the base 1, as shown in FIG. 14A. When the wire routing region shown in FIG. 4 is located in a camera under panel region, a material of the first conductive layer 2' is a transparent conductive material, for example, ITO, etc. When the wire routing region shown in FIG. 4 is located in the sector region of the bezel region, the material of the first conductive layer 2' is a metal material, for example, Ag, Al, etc.

Figure 14B:
Figure 14C:
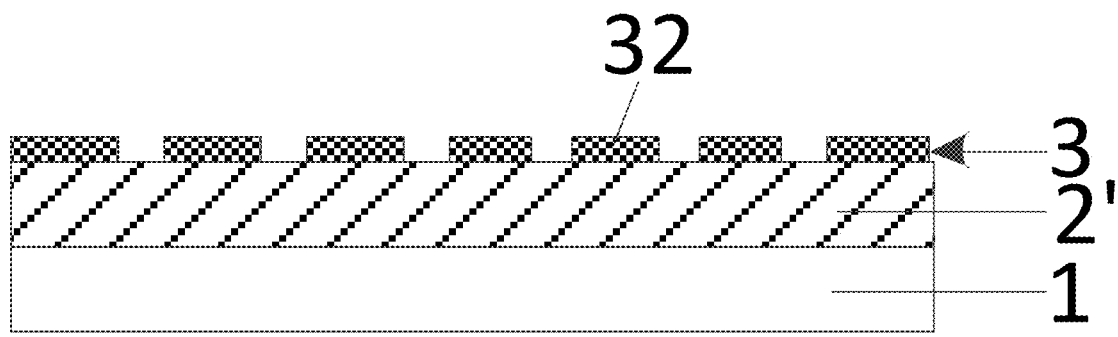

(2) As shown in FIG. 14B, the insulation layer 3 is deposited on a side of the first conductive layer 2' facing away from the base 1, a material of the insulation layer 3 includes but is not limited to one or a combination of SiNx and SiOx. As shown in FIG. 14C, the insulation layer 3 is patterned to form a patterned insulation layer 3 (including a plurality of sub-insulation layers 32 arranged independently).

Figure 14D:
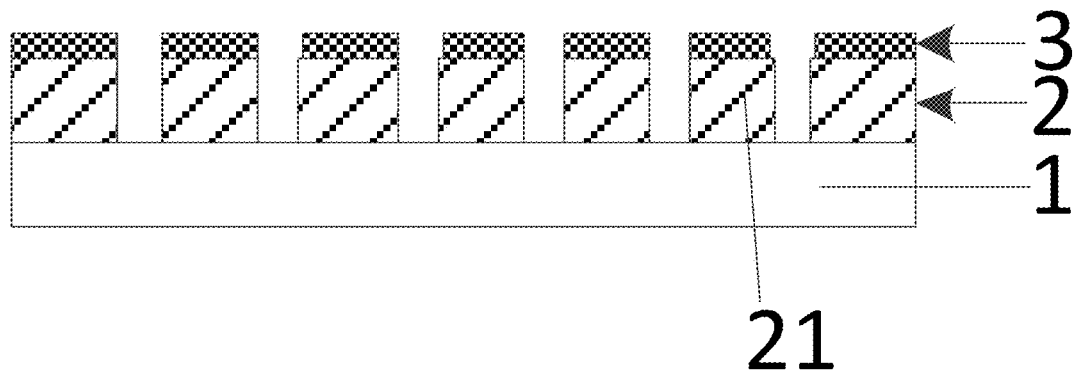

(3) Etching is performed on the first conductive layer 2' by using the patterned insulation layer 3 shown in FIG. 14C as a mask to form a plurality of first routing wires 21 arranged independently, as shown in FIG. 14D, the plurality of first routing wires 21 form a first wire routing layer 2. Compared with etching a conductive layer by using a photoresist material as a mask in the related art, exposure resolution of the insulation layer 3 is higher, and a smaller wire width/wire space ratio may be manufactured. At present, as for manufacturing of routing wires by using the photoresist process, due to requirements of the minimum wire width and the minimum wire space, routing wires on the same layer have the minimum wire width and wire space, manufacturing limits in a factory at present include the minimum wire width (2 um) and the minimum wire space (2 um), so the quantity of the routing wires distributed on the same layer is limited. The disclosure replaces photoresist in the related art with the insulation layer 3, the first wire routing layer 2 is etched by using the insulation layer 3 as the mask, so a plurality of first routing wires 21 with a smaller wire width/wire space ratio may be manufactured on the first wire routing layer 2, that is, a space S between every adjacent first routing wires 21 is smaller than 2 um, and a wire width W of each of the first routing wires 21 is smaller than 2 um. In this way, more routing wires can be distributed on the same wire routing layer, so the quantity of masks is reduced, cost is reduced, and input time is shortened. In an embodiment of the disclosure, optionally, the wire width of each of the first routing wires 21 is 1.5 um, and the space between every adjacent first routing wires 21 is 2 um.

Figure 14E:
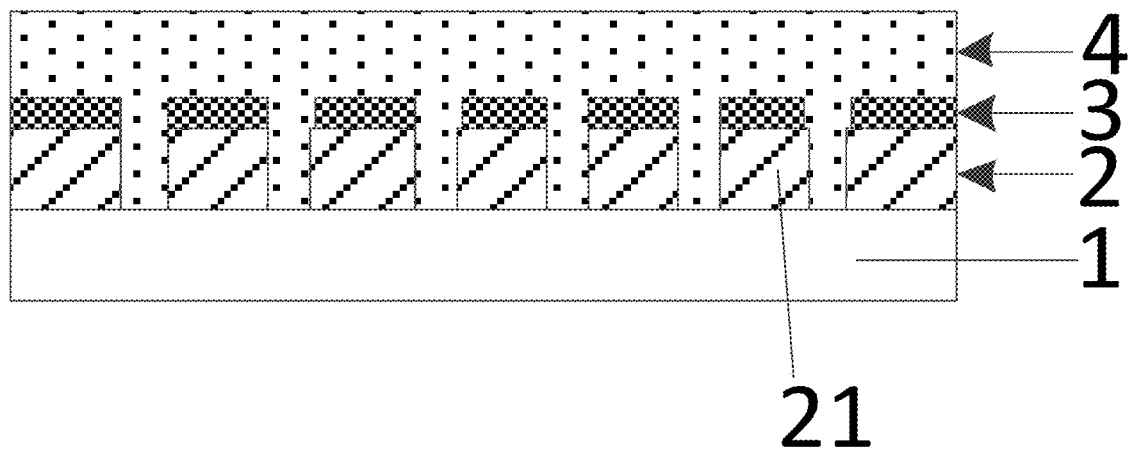
Figure 14F:
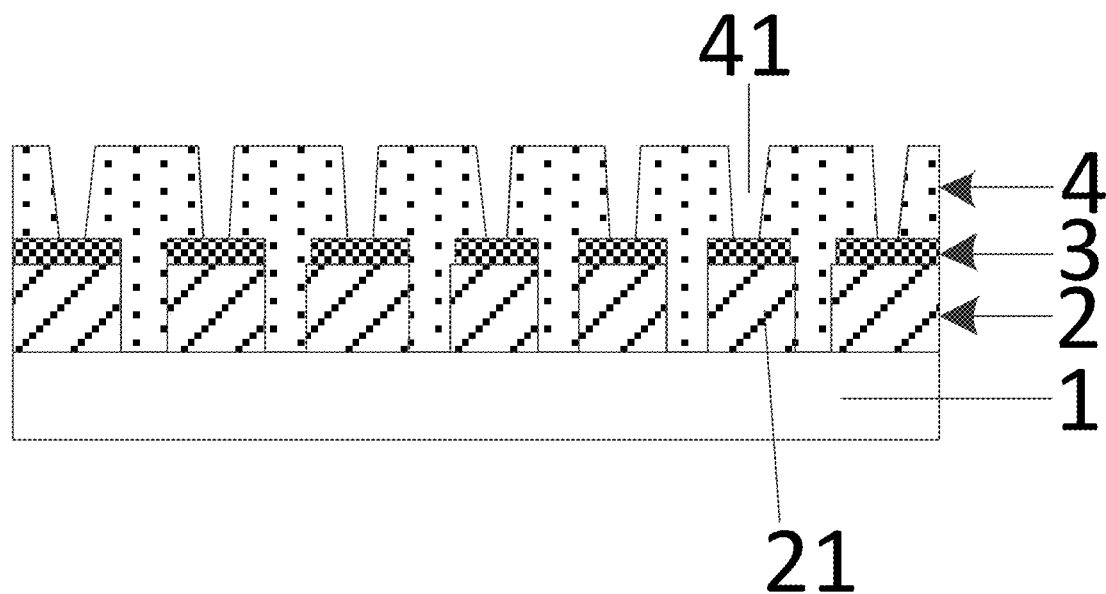

(4) The first flat layer 4 is deposited on a side of the patterned insulation layer 3 facing away from the base 1, as shown in FIG. 14E. The first flat layer 4 is patterned to form second via holes 41 corresponding to the first routing wires 21, as shown in FIG. 14F.

Figure 14G:
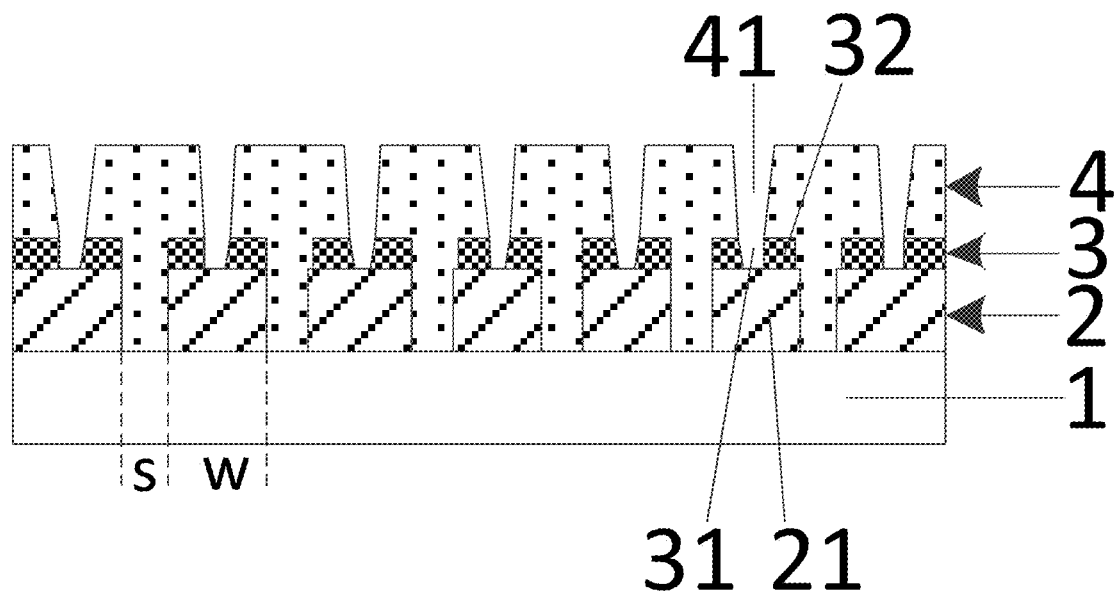

(5) The patterned insulation layer 3 is etched by using the first flat layer 4 with the second via holes 41 as a mask so that the first via holes 31 corresponding to the second via holes 41 are formed in the insulation layer 3, as shown in FIG. 14G.

Figure 14H:
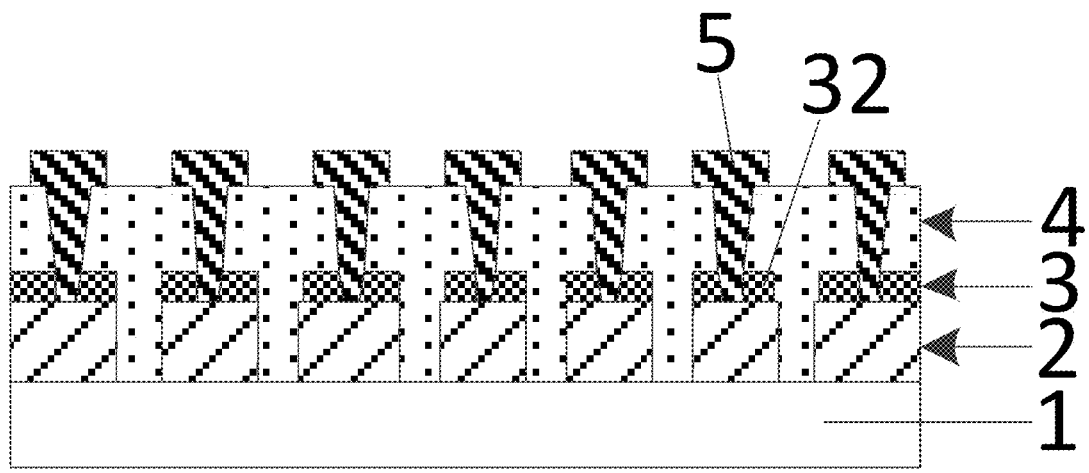

(6) When the wire routing region shown in FIG. 5 is located in the camera under panel region, a plurality of anodes 5 are formed on a side of the first flat layer 4 with the second via holes 41 formed thereof facing away from the base 1. The anodes 5 are electrically connected with the first routing wires 21 through corresponding second via holes 41 and corresponding first via holes 31, as shown FIG. 14H.

The manufacturing method of the display substrate shown in FIG. 5 is described in detail below, which may include following steps.

Figure 15A:
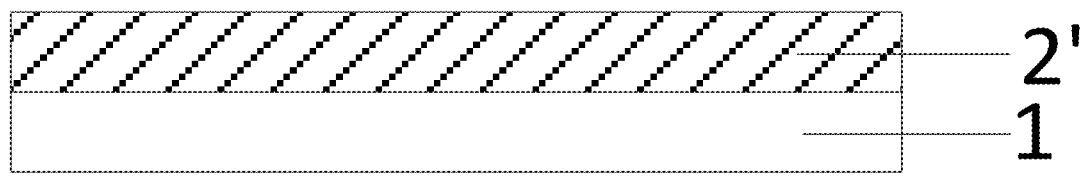
FIG. 15A to FIG. 15I are schematic sectional views after executing every step of manufacturing the display substrate shown in FIG. 5.

(1) The first conductive layer 2' is deposited on the wire routing region of the base 1, as shown in FIG. 15A. When the wire routing region shown in FIG. 5 is located in a camera under panel region, a material of the first conductive layer 2' is a transparent conductive material, for example, ITO, etc. When the wire routing region shown in FIG. 5 is located in the sector region of the bezel region, the material of the first conductive layer 2' is a metal material, for example, Ag, Al, etc.

Figure 15B:
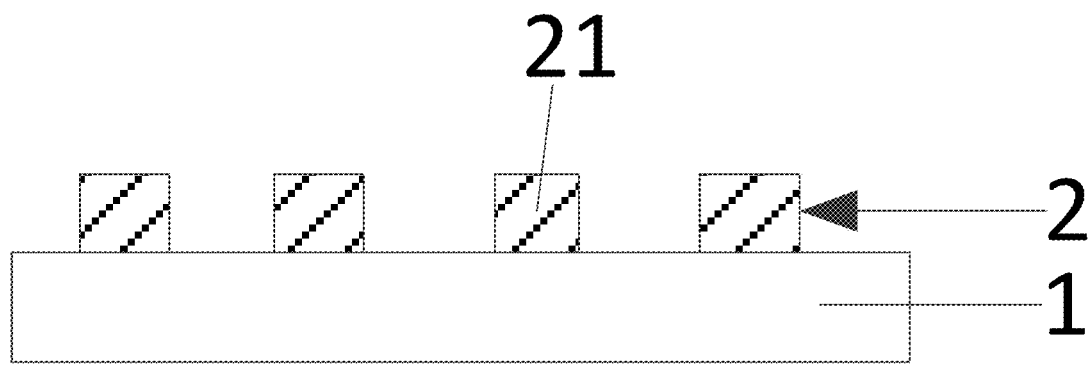

(2) The first conductive layer 2' is patterned to form a plurality of first routing wires 21 arranged independently, as shown in FIG. 15B, the plurality of first routing wires 21 form a first wire routing layer 2.

Figure 15C:
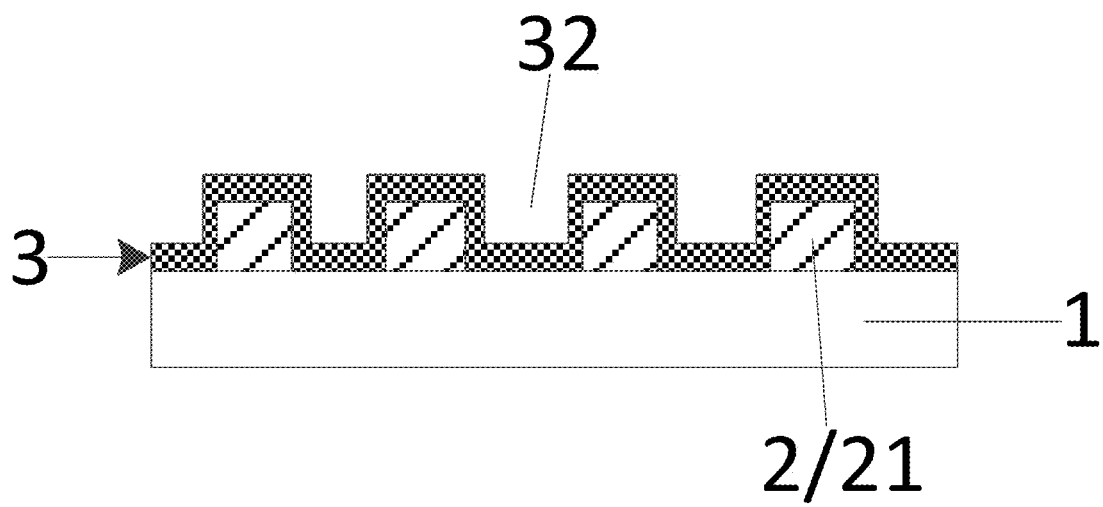

(3) The insulation layer 3 is deposited on a side of the first conductive layer 2' with the plurality of first routing wires 21 formed thereon facing away from the base 1; and grooves 32 are defined by the insulation layer 3 between the adjacent first routing wires 21, as shown in FIG. 15C.

Figure 15D:
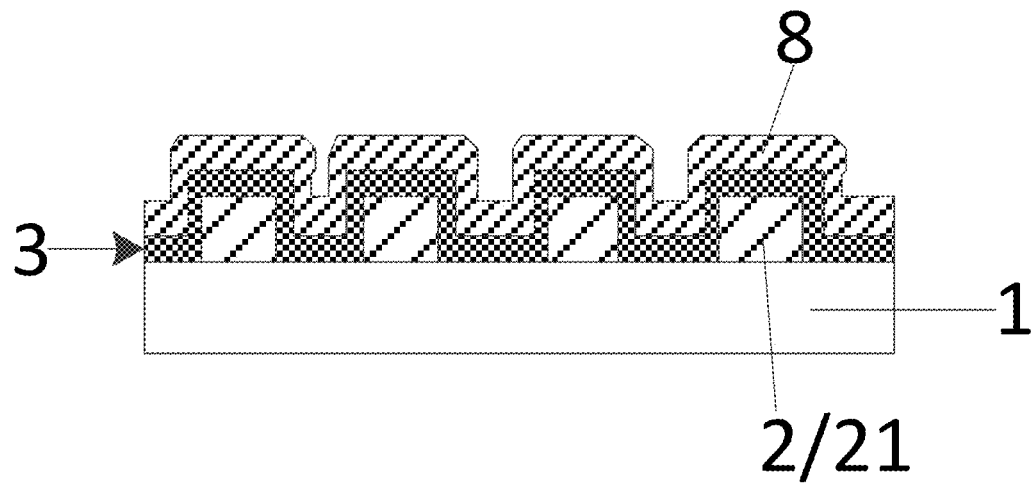
Figure 15E:
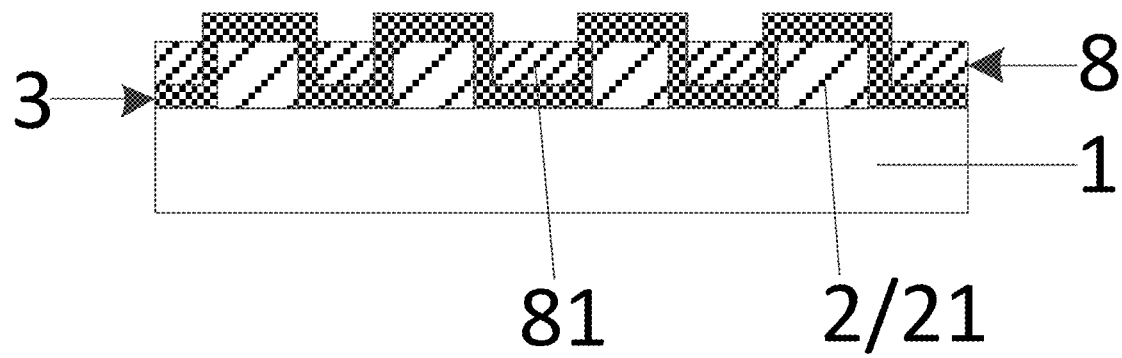

(4) A second conductive layer 8' is deposited on a side of the insulation layer 3 facing away from the base 1, as shown in FIG. 15D. Patterning is performed on the second conductive layer 8' to form a plurality of second routing wires 81 at least partially located in corresponding grooves 32, as shown in FIG. 15E. A thickness of the second conductive layer 8' before patterning is larger than a thickness of the first conductive layer 2' before patterning. In this way, wiring of the second routing wires 81 and the first routing wires 21 is equivalent to wiring on the same layer, a wiring space is not limited to the wire width and the wire space, wiring in spacing of 0 can be performed between two layers of routing wires, so 100 routing wires can be distributed within a space of 200 um, the quantity of the layers of the routing wires can be reduced by half, and thus the quantity of the masks of a flat layer can be reduced by half.

Figure 15F:
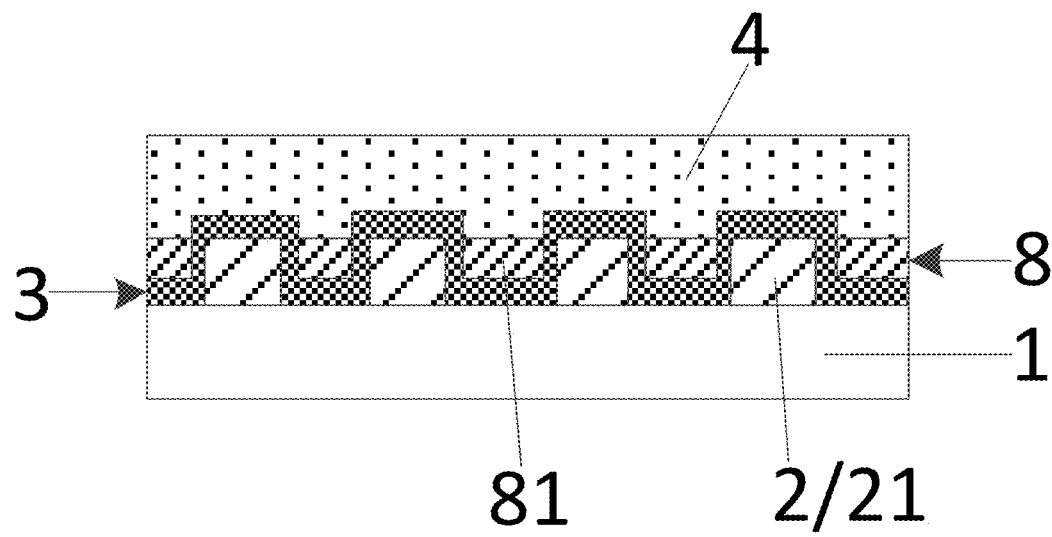
Figure 15G:
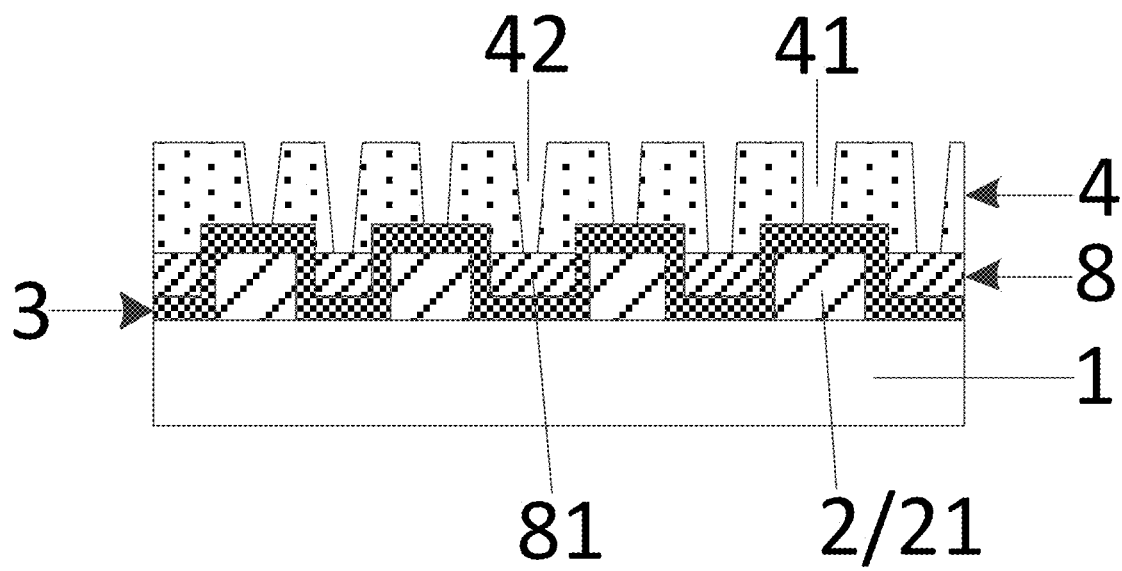

(5) A first flat layer 4 is deposited on a side of the second conductive layer 8' with the plurality of second routing wires 81 formed thereon facing away from the base 1, as shown in FIG. 15F. Patterning is performed on the first flat layer 4 to form the second via holes 41 corresponding to the first routing wires 21 and third via holes 42 corresponding to the second routing wires 81, as shown in FIG. 15G.

Figure 15H:
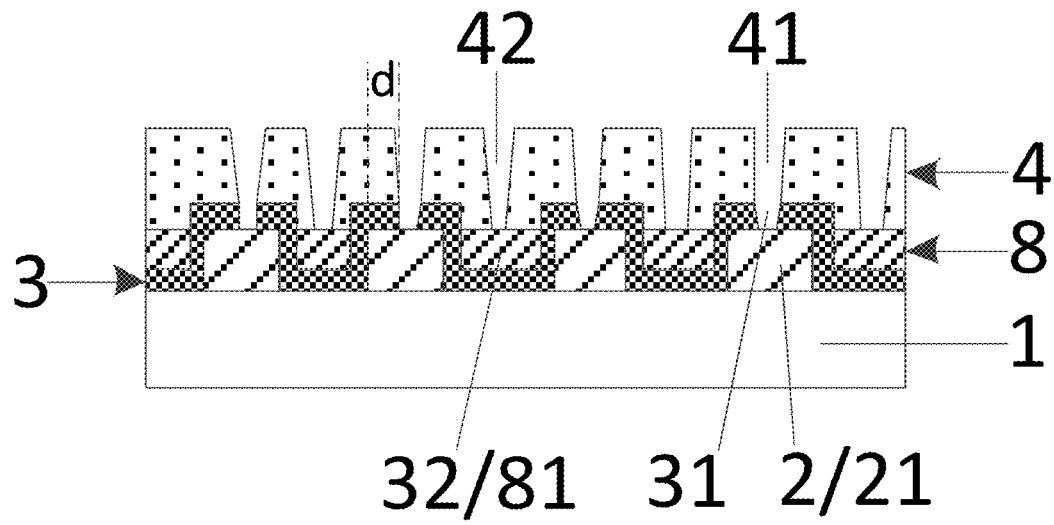

(6) Etching is performed on the insulation layer 3 by using the first flat layer 4 with the second via holes 41 and the third via holes 42 as a mask to form the first via holes 31 corresponding to the second via holes 41, as shown in FIG. 15H.

Figure 15I:
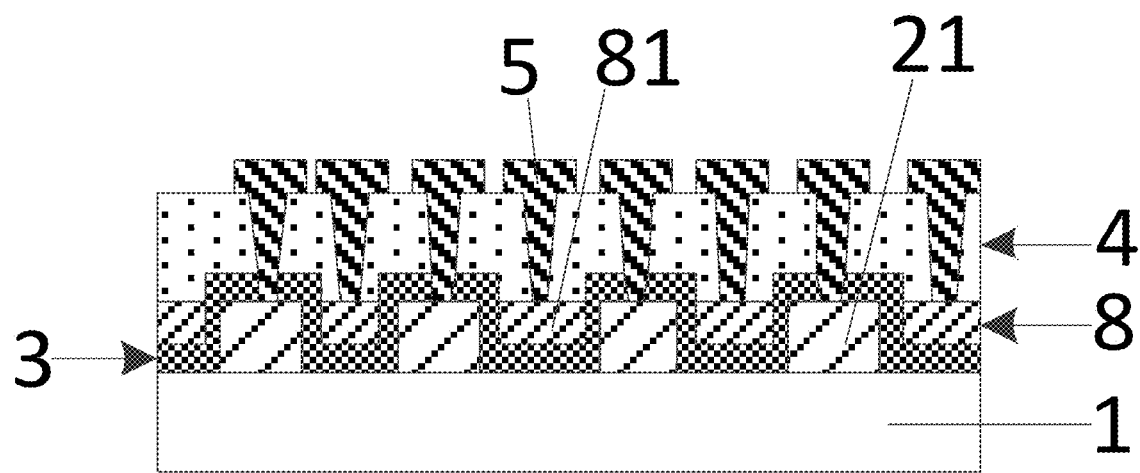

(7) When the wire routing region shown in FIG. 5 is located in the camera under panel region, a plurality of anodes 5 are formed on a side of the first flat layer 4 with the second via holes 41 and the third via holes 42 formed thereon facing away from the base 1, a part of the anodes 5 are electrically connected with the first routing wires 21 through corresponding second via holes 41 and corresponding first via holes 31, and a part of the anodes 5 are electrically connected with the second routing wires 81 through corresponding third via holes 42, as shown in FIG. 15I.

During specific implementation, as a part of the second routing wires 81 may be etched when the insulation layer 3 is etched by using the first flat layer 4 as the mask in FIG. 15H, in order to make a surface of the first routing wires 21 approximately flush with a surface of the second routing wires 81, in the above manufacturing method provided by an embodiment of the disclosure, as shown in FIG. 15A and FIG. 15D, the thickness of the second conductive layer 8' before patterning is about 200 Å larger than the thickness of the first conductive layer 2' before patterning. For example, the thickness of the first routing wires 21 may be 600 Å, and the thickness of the second routing wires 81 may be 800 Å. In this way, a thickness of the rest of second routing wires 81 after dry etching is finished is close to the thickness of the first routing wires 21, so a sum of the thickness of the second routing wires 81 and a thickness of the insulation layer 3 are approximately equal to the thickness of the first routing wires 21.

It should be noted that a shape of the first display region AA1 in the disclosure may be circular as shown in FIG. 1 and FIG. 7, or may be rectangular, elliptical or polygonal and other shapes, which may be designed according to actual requirements and is not limited herein. The second display region AA2 may encircle the surrounding of the first display region AA1 as shown in FIG. 1 and FIG. 7, or may surround a part of the first display region AA1, for example, surrounding a left side, a lower side and a right side of the first display region AA1, and an upper side boundary of the first display region AA1 coincides with an upper side boundary of the second display region AA2.

Optionally, in the above display substrate provided by an embodiment of the disclosure, as shown in FIG. 1 and FIG. 7, the first display region AA1 is configured to be provided with a photosensitive device, for example, a camera module. As only the light-emitting devices exist in the first display region AA1, a light transmittance region of a larger area can be provided, which is good for being matched with a larger-size camera module.

Based on the same inventive concept, an embodiment of the disclosure further provides a display apparatus, including the above display substrate.

During specific implementation, the above display apparatus further includes a photosensitive device (for example, the camera module), and the photosensitive device is arranged in the first display region of the display substrate. Optionally, the photosensitive device may be the camera module.

The display apparatus may be: a mobile phone, a tablet computer, TV, a display, a notebook computer, a digital photo frame, a navigator, a smart watch, a fitness wristband, a personal digital assistant and any other product or component with a display function. Other essential components of the display apparatus should be understood by those ordinarily skilled in the art, which is neither described in detail herein, nor used to limit the disclosure. Besides, as a principle of solving problems of the display apparatus is similar to a principle of solving problems of the above display substrate, implementation of the display apparatus may refer to an embodiment of the above display substrate, and repetitions are not described in detail.

According to the display substrate and the manufacturing method thereof and the display apparatus provided by embodiments of the disclosure, the insulation layer is arranged between the first wire routing layer and the first flat layer. In this way, the method of manufacturing the routing wires by using the photoresist process in the related art can be changed, so more wires can be distributed within the same wiring space. As for the same quantity of routing wires, the disclosure can reduce the quantity of the layers of the routing wires, then the flat layers above the routing layers can be reduced, thus the quantity of the masks for patterning is reduced, and manufacturing cost is reduced.

Although embodiments of the disclosure have already been described, those skilled in the art can make other changes and modifications to these embodiments once they know a basic inventive concept. Therefore, appended claims intend to be constructed as including embodiments and all changes and modifications falling within the scope of the disclosure.

Apparently, those skilled in the art can make various changes and modifications to embodiments of the disclosure without departing from the spirit and scope of embodiments of the disclosure. In this case, if these changes and modifications of embodiments of the disclosure fall within the scope of the claims and their equivalents of the disclosure, the disclosure also intends to contain these changes and modifications.

What is claimed is:

1. A display substrate, comprising:
a base, having a wire routing region;
a first wire routing layer, located on the base, wherein the first wire routing layer in the wire routing region comprises a plurality of first routing wires arranged at intervals, and a space between adjacent first routing wires is smaller than 2 μm;
an insulation layer, located on a side of the first wire routing layer facing away from the base and having a plurality of first via holes corresponding to the first routing wires; and
a first flat layer, located on a side of the insulation layer facing away from the base and having second via holes corresponding to the first via holes, wherein the second via holes at least partially overlap with the first via holes;
wherein the insulation layer comprises a plurality of independent sub-insulation layers corresponding to the first routing wires, the sub-insulation layers have the first via holes, and a wire width of each of the first routing wires is smaller than or equal to 2 μm.

2. The display substrate according to claim 1, wherein the space between adjacent first routing wires is 0.8 μm to 1.8 μm, and the wire width of each of the first routing wires is 1.0 μm to 1.8 μm.

3. The display substrate according to claim 1, comprising a display region and a bezel region, wherein the display region comprises a first display region and a second display region, and light transmittance of the first display region is larger than light transmittance of the second display region;
the first display region comprises a plurality of sub-pixels distributed in an array, wherein the sub-pixels comprise light-emitting devices and a pixel circuit, the pixel circuit is located in the bezel region adjacent to the first display region, or the second display region has a transition region adjacent to the first display region, and the pixel circuit is located in the transition region;

the wire routing region is at least partially located in the first display region, and the first wire routing layer is located between anodes of the light-emitting devices and the pixel circuit; and the first routing wires are electrically connected with the anodes of the light-emitting devices through corresponding first via holes and corresponding second via holes.

4. The display substrate according to claim 3, further comprising a second flat layer located between the pixel circuit and the first wire routing layer, wherein the second flat layer has a plurality of fourth via holes corresponding to the first routing wires; and the first routing wires are electrically connected with the pixel circuit through corresponding fourth via holes.

5. The display substrate according to claim 1, comprising a display region and a bezel region, wherein the display region comprises a plurality of signal lines, and the bezel region comprises the wire routing region; and the first routing wires are configured to be electrically connected with corresponding signal lines.

6. The display substrate according to claim 1, further comprising a second wire routing layer located between the insulation layer and the first flat layer, wherein the second wire routing layer in the wire routing region comprises a plurality of second routing wires arranged at intervals; and grooves are defined by the insulation layer between the adjacent first routing wires, and the second routing wires are at least located in the grooves.

7. The display substrate according to claim 6, wherein a width of an orthographic projection of each of the second routing wires on the base is smaller than a width of an orthographic projection of the insulation layer between adjacent first via holes on the base.

8. The display substrate according to claim 7, wherein the orthographic projection of each of the second routing wires on the base approximately overlaps with an orthographic projection of a space between the adjacent first routing wires on the base.

9. The display substrate according to claim 7, wherein a width of each of the first routing wires is larger than or equal to 1.5 μm and smaller than 2 μm, and a maximum width of each of the first via holes is larger than or equal to 1.1 μm and smaller than 1.6 μm; and an orthographic projection of each of the first routing wires on the base has a first annular side edge, an orthographic projection of each of the first via holes on the base has a second annular side edge, and a space between the first annular side edge and the second annular side edge is larger than or equal to 0.2 μm.

10. The display substrate according to claim 6, wherein the first flat layer has third via holes corresponding to the second routing wires.

11. The display substrate according to claim 6, wherein a sum of a thickness of the second routing wires and a thickness of the insulation layer is approximately equal to a thickness of the first routing wires.

12. The display substrate according to claim 6, comprising a display region and a bezel region, wherein the display region comprises a first display region and a second display region, and light transmittance of the first display region is larger than light transmittance of the second display region; the first display region comprises a plurality of sub-pixels distributed in an array, the sub-pixels comprise light-emitting devices and a pixel circuit, the pixel circuit is located in the bezel region adjacent to the first display region, or the second display region has a transition region adjacent to the first display region, and the pixel circuit is located in the transition region;

the wire routing region is at least partially located in the first display region, and the first wire routing layer and the second wire routing layer are located between the light-emitting devices and the pixel circuit; and the first routing wires are electrically connected with anodes of the light-emitting devices through corresponding first via holes and corresponding second via holes, and the second routing wires are electrically connected with the anodes of the light-emitting devices through corresponding third via holes.

13. The display substrate according to claim 12, further comprising a second flat layer located between the pixel circuit and the first wire routing layer, wherein the second flat layer has a plurality of fourth via holes corresponding to the first routing wires and the second routing wires, and the insulation layer has fifth via holes corresponding to the second routing wires; and the first routing wires are electrically connected with the pixel circuit through corresponding fourth via holes, and the second routing wires are electrically connected with the pixel circuit through corresponding fourth via holes and corresponding fifth via holes.

14. The display substrate according to claim 6, comprising a display region and a bezel region, the display region comprises a plurality of signal lines, and the bezel region comprises the wire routing region; and the first routing wires are configured to be electrically connected with corresponding signal lines, and the second routing wires are configured to be electrically connected with corresponding signal lines.

15. The display substrate according to claim 1, wherein the thickness of the insulation layer is 700 Å to 800 Å.

16. A manufacturing method of the display substrate according to claim 1, comprising:

providing the base, wherein the base has a wire routing region;

forming the first wire routing layer and the insulation layer on the base, wherein the first wire routing layer in the wire routing region comprises the plurality of first routing wires arranged independently, the insulation layer is located on the side of the first wire routing layer facing away from the base, and the insulation layer has the plurality of first via holes corresponding to the first routing wires; and forming the first flat layer on the side of the insulation layer facing away from the base, wherein the first flat layer has second via holes corresponding to the first via holes, and the second via holes at least partially overlap with the first via holes.

17. The manufacturing method according to claim 16, wherein the forming the first wire routing layer and the insulation layer on the base comprises:

depositing a first conductive layer on the wire routing region of the base;

depositing the insulation layer on a side of the first conductive layer facing away from the base, and patterning the insulation layer to form a patterned insulation layer;

etching the first conductive layer by using the patterned insulation layer as a mask to form the plurality of first routing wires arranged independently;

depositing the first flat layer on a side of the patterned insulation layer facing away from the base, and patterning the first flat layer to form the second via holes corresponding to the first routing wires; and etching the patterned insulation layer by using the first flat layer with the second via holes as a mask to form the first via holes corresponding to the second via holes.

18. The manufacturing method according to claim 16, wherein the forming the first wire routing layer and the insulation layer on the base comprises:

depositing a first conductive layer on the wire routing region of the base;

patterning the first conductive layer to form the plurality of first routing wires arranged independently;

depositing the insulation layer on a side of the first conductive layer with the plurality of first routing wires formed thereon facing away from the base, wherein grooves are defined by the insulation layer between the adjacent first routing wires;

depositing a second conductive layer on a side of the insulation layer facing away from the base, and patterning the second conductive layer to form the plurality of second routing wires at least located in corresponding grooves, and a thickness of the second conductive layer before patterning is larger than a thickness of the first conductive layer before patterning;

depositing a first flat layer on a side of the second conductive layer with the plurality of second routing wires formed thereon facing away from the base, and patterning the first flat layer to form the second via holes corresponding to the first routing wires, and third via holes corresponding to the second routing wires; and etching the insulation layer by using the first flat layer having the second via holes and the third via holes as a mask to form the first via holes corresponding to the second via holes.

19. A display apparatus, comprising the display substrate according to claim 1.

20. A display substrate, comprising:

a base, having a wire routing region;

a first wire routing layer, located on the base, wherein the first wire routing layer in the wire routing region comprises a plurality of first routing wires arranged at intervals, and a space between adjacent first routing wires is smaller than 2 µm;

an insulation layer, located on a side of the first wire routing layer facing away from the base and having a plurality of first via holes corresponding to the first routing wires; and a first flat layer, located on a side of the insulation layer facing away from the base and having second via holes corresponding to the first via holes, wherein the second via holes at least partially overlap with the first via holes;

a second wire routing layer located between the insulation layer and the first flat layer, wherein the second wire routing layer in the wire routing region comprises a plurality of second routing wires arranged at intervals; and grooves are defined by the insulation layer between the adjacent first routing wires, and the second routing wires are at least located in the grooves.

\* \* \* \* \*